(12) United States Patent
Matsumoto

(10) Patent No.: US 7,395,484 B2
(45) Date of Patent: Jul. 1, 2008

(54) CHECK MATRIX GENERATION METHOD AND CHECK MATRIX GENERATION DEVICE

(75) Inventor: Wataru Matsumoto, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 45 days.

(21) Appl. No.: 10/518,444

(22) PCT Filed: Jun. 12, 2003

(86) PCT No.: PCT/JP03/07476

§ 371 (c)(1),
(2), (4) Date: Dec. 20, 2004

(87) PCT Pub. No.: WO2004/006444

PCT Pub. Date: Jan. 15, 2004

(65) Prior Publication Data

US 2005/0246615 A1 Nov. 3, 2005

(30) Foreign Application Priority Data

Jul. 2, 2002 (JP) ............................. 2002-193767

(51) Int. Cl.
*H03M 13/00* (2006.01)
(52) U.S. Cl. ....................................... 714/758
(58) Field of Classification Search ................. 714/758, 714/801
See application file for complete search history.

(56) References Cited

U.S. PATENT DOCUMENTS

| | | | |
|---|---|---|---|
| 4,862,463 A * | 8/1989 | Chen ........................... | 714/767 |
| 6,715,121 B1 | 3/2004 | Laurent | |
| 6,789,227 B2 * | 9/2004 | De Souza et al. ........... | 714/804 |
| 6,961,888 B2 * | 11/2005 | Jin et al. ...................... | 714/752 |
| 6,968,491 B1 * | 11/2005 | Yang et al. ................... | 714/752 |
| 2002/0163892 A1 * | 11/2002 | Hassibi et al. .............. | 370/310 |
| 2002/0188906 A1 * | 12/2002 | Kurtas et al. ................ | 714/755 |

FOREIGN PATENT DOCUMENTS

EP 0 611 054 A2 8/1994

(Continued)

OTHER PUBLICATIONS

Low Density parity Check codes based on sparse matrices with no small cycles, Bond et al. Springer Berlin/Heidelberg, 1997, pp. 46-58.*

(Continued)

*Primary Examiner*—Guy Lamarre
*Assistant Examiner*—Sam Rizk
(74) *Attorney, Agent, or Firm*—Birch, Stewart, Kolasch & Birch, LLP

(57) ABSTRACT

A method of generating a check matrix for a LDPC code includes determining a code length and a coding rate, and a basic matrix; selecting a maximum value of the weight of the column; searching an ensemble of the weights of the row and the column weights; deleting the rows sequentially from a bottom of the basic matrix; searching an ensemble of the weights of the row and the column using the set of the weights of the row as a fixed parameter, to determine an optimum set of the weights of the column; searching an optimal ensemble of the weights of the row and the column using the set of the weights of the row and the column as a fixed parameter; and dividing at random the weights of the row and the column of the basic matrix after deleting the rows in a predetermined procedure based on a final ensemble.

12 Claims, 14 Drawing Sheets

FOREIGN PATENT DOCUMENTS

| JP | 6-223095 A | 8/1994 |
|----|------------|--------|
| JP | 6-223096 A | 8/1994 |
| JP | 2001-168733 A | 6/2001 |

OTHER PUBLICATIONS

R.G. Gallager., "Low-Density Parity-Check Codes", Cambridge, MA: MIT Press, 1963.

Y. Kou et al., "Low Density Parity Check Codes Based on Finite Geometries: A Rediscovery," ISIT 2000, pp. 200, Sorrento, Italy, Jun. 25 to 30, 2000.

Ludy et al., "Improved Low-Density Parity-Check Codes Using Irregular Graphs and Belief Propagation", Proceedings of 1998 IEEE International Symposium of INformation Theory, pp. 171, Cambridge, Mass., Aug. 16 to 21, 1998.

Richardson et al., "The capacity of low-density parity-check codes under message-passing decoding", IEEE Trans. Inform. Theory, vol. 47, No. 2, pp. 599 to 618, Feb. 2001.

Chung et al., "Analysis of Sum-Product Decoding of Low-Density Parity-Check Codes Using a Gaussian Approxiamation", IEEE Tans. Inform. Theory, vol. 47, No. 2, pp. 657 to 670, Feb. 2001.

J. Rosenthal, P.O. Vontobel, "Construction of LDPC codes using Ramnujan graphs and ideas from Margulis", in Proc. of the 38th Allerton Conference on Communication, Control, Computing, 2000, pp. 248-257.

Matsumoto W et al: "Deterministic irregular low-density parity-check codes design scheme" Proc , Kiso Kyokai Society Meeting. vol. A-6-12, Sep. 10, 2002, p. 126, XP002903378.

Rosenthal J et al: "Constructions of regular and irregular LDPC codes using Remanujan graphs and ideas from margulis" Proc., IEEE International Symposium on Information Theory, ISIT 2001, Washington, WA, US, Jun. 24, 2001 p. 4, XP010552621 ISBN 0-7803-7123-2.

Vontobel P.O. et al: "Irregular codes from regular graphs" Proc , IEEE International Symposium on Information Theory, ISIT 02, Lausanna, Switzerland, Jun. 30, 2003-Jul. 5, 2002 p. 284, XP010601995 ISBN 0-7803-7501-7.

Chiani M et al: "Design and performance evaluation of some high-rate irregular low-density parity-check codes" Proc , IEEE Global Telecommunications Conference, Globecom 2001, San Antonio, TX, vol. vol. 2 of 6, Nov. 25, 2001 (Nov. 29, 2001) pp. 990-994, XP001099253 ISBN 0-7803-7206-9.

Luby M.G et al: "Analysis of low density codes and improved designs using irregular graphs" Proc., 30th Annual ACM Symposium on Theory of Computing Dallas, TX, May 23, 1998, pp. 249-258, XP000970907 ISBN 0-89791-962-9.

Luby M G. et al: "Improved Low-Density Parity-Check Codes Using Irregular Graphs" IEEE Transactions on Information Theory, vol. 47, No. 2, Feb. 2001, XP011027875 ISSN 0018-9448.

Yu Kuo et al: "Low-Density Parity-Check Codes Based on Finite Geometrics: A Rediscovery and New Results" IEEE Transactions on Information Theory, IEEE Service Center, Piscataway, NJ, US, vol. 47, No. 7, Nov. 2001, XP011028087 ISSN 0018-9448.

Rosenthal J and Vontobel P.O : "Constructions of LDPC codes using Ramanujan graphs and ideas from Margulis" Proc , 38th Allerton Conference on Communication, Control and Computing, Allerton House, Monticello, Illinois, Oct. 4, 2000-Oct. 6, 2000 pp. 1-10, XP002416895 Retrieved from the Internet: URL: http://www.hpl.hp.com/personal/Pascal_Vontobel/publications/papers/pcto-00-3.pdf.

Matsumoto W et al: "Irregular extended Euclidean geometry low-density parity-check codes" Proc., International Symposium on Communication Systems Networks and Digital Signal Processing, CSNDSP 2002, Stafford, UK, Jul. 15, 2002, pp. 148-151, XP002370884.

Chung, S Y et al: "Analysis pf Sum-Product Decoding of Low-Density Parity-Check Codes Using a Gaussian Approximation" IEEE Transactions on Information Theory, vol. 47, No. 2, Feb. 2001, pp. 657-670, XP011027864 ISSN 0018-9448.

* cited by examiner

FIG.4

| $d_l$ | 12 | |
|---|---|---|
| Rate | 0.5 | |
| | x | $\lambda_x$ |
| | 2 | 0.221354 |
| | 3 | 0.281879 |
| | 6 | 0.021475 |
| | 7 | 0.0001 |
| | 10 | 8.71E-05 |
| | 12 | 0.475104 |
| | X | $\rho_x$ |
| | 8 | 0.92192 |
| | 9 | 0.07808 |
| $\sigma_{GA}$ | 0.946711 | |
| $SNR_{norm}(GA)$ | 0.2886dB | |

FIG.5

| $d_l$ | 12 | |
|---|---|---|
| Rate | 0.5 | |
| | x | $\lambda_x$ |
| | 2 | 0.221354 |
| | 3 | 0.281879 |
| | 6 | 0.021475 |
| | 7 | 0.0001 |
| | 12 | 0.475104 |
| | X | $\rho_x$ |
| | 8 | 0.92192 |
| | 9 | 0.07808 |
| $\sigma_{GA}$ | 0.946736 | |
| $SNR_{norm}(GA)$ | 0.2884dB | |

FIG.6

| $d_l$ | 12 | |
|---|---|---|
| Rate | 0.5 | |
| | x | $\lambda_x$ |
| | 2 | 0.224033 |
| | 3 | 0.282078 |
| | 6 | 0.033481 |
| | 7 | 0.000166 |
| | 12 | 0.460242 |
| | X | $\rho_x$ |
| | 8 | 1 |
| $\sigma_{GA}$ | 0.947054 | |
| $SNR_{norm}(GA)$ | 0.2855dB | |

FIG.7

| 1 | 2 | 3 | 4 | 5 | 6 | 7 | 8 | 9 | 10 | 11 |
|---|---|---|---|---|---|---|---|---|---|---|
| | x | $\lambda x$ | | | | | | | x | $\lambda x$ |
| VARIABLE NODE (COLUMN) | 2 | 0.2240333399 | 5376.802 | 2688.401 | 2688 | 5376 | 5372 | 2686 | 2 | 0.2238333333 |
| | 3 | 0.2820777752 | 6769.866 | 2256.622 | 2257 | 6771 | 6777 | 2259 | 3 | 0.282375 |
| | 6 | 0.0334810784 | 803.5459 | 133.9243 | 134 | 804 | 804 | 134 | 6 | 0.0335 |
| | 7 | 0.000166151 | 3.98762 | 0.56966 | 1 | 7 | 7 | 1 | 7 | 0.000291667 |
| | 12 | 0.46024162 | 11045.8 | 920.4832 | 920 | 11040 | 11040 | 920 | 12 | 0.46 |
| TOTAL | | 0.582003275 | 24000 | 6000 | 6000 | 23998 | 24000 | 6000 | | 1 |
| | x | $\rho x$ | | | | | | | x | $\rho x$ |
| CHECK NODE (ROW) | 8 | 1 | 24000 | 3000 | 3000 | 24000 | 24000 | 3000 | 8 | 1 |
| | | 1 | 24000 | 3000 | 3000 | 24000 | 24000 | 3000 | | 1 |
| rate | | 0.500000001 | | | | | | | | 0.5 |

• TOTAL NUMBER TP OF 1S WITHIN COLUMNS=(1023-273)×32=24000

FIG.8

| $d_l$ | 12 | | |
|---|---|---|---|
| CODE LENGTH | 6000 | | |
| | x | $\lambda_x$ | No. |
| | 2 | 0.223833 | 2686 |
| | 3 | 0.282375 | 2259 |
| | 6 | 0.0335 | 134 |
| | 7 | 0.000292 | 1 |
| | 12 | 0.46 | 920 |
| | X | $\rho_x$ | No. |
| | 8 | 1 | 3000 |
| $\sigma_{GA}$ | 0.946999 | | |
| $SNR_{norm}(GA)$ | 0.2860dB | | |

FIG.9

|    | 1 | 2 | 3 | 4 | 5 | 6 | 7 | 8 | 9 | 10 | 11 | 12 | 13 |
|----|---|---|---|---|---|---|---|---|---|----|----|----|----|
| 1  |   |   |   |   |   |   |   |   |   |    |    |    |    |
| 2  |   |   |   |   |   |   |   |   |   |    |    |    |    |
| 3  |   |   |   |   |   |   |   |   |   |    |    |    |    |
| 4  |   |   |   |   |   |   |   |   |   |    |    |    |    |
| 5  |   |   |   |   |   |   |   |   |   |    |    |    |    |
| 6  |   |   |   |   |   |   |   |   |   |    |    |    |    |
| 7  |   |   |   |   |   |   |   |   |   |    |    |    |    |
| 8  |   |   |   |   |   |   |   |   |   |    |    |    |    |
| 9  |   |   |   |   |   |   |   |   |   |    |    |    |    |
| 10 |   |   |   |   |   |   |   |   |   |    |    |    |    |
| 11 |   |   |   |   |   |   |   |   |   |    |    |    |    |
| 12 |   |   |   |   |   |   |   |   |   |    |    |    |    |
| 13 |   |   |   |   |   |   |   |   |   |    |    |    |    |

PRIOR ART

FIG. 16

CHECK MATRIX GENERATION METHOD AND CHECK MATRIX GENERATION DEVICE

TECHNICAL FIELD

The present invention relates to a method and an apparatus for generating a check matrix for a low density parity check (LDPC) code that is employed as an error correcting code, and more particularly, to a method and an apparatus for generating a check matrix capable of searching a definite and characteristic stabilized check matrix for the LDPC code.

BACKGROUND ART

A conventional method of generating a check matrix for an LDPC code will be explained below. FIG. 13 illustrates an LDPC encoding/decoding system. Reference numeral 101 denotes an encoder, 102 denotes a modulator, 103 denotes a channel, 104 denotes a demodulator, and 105 denotes a decoder. Prior to explanation of a conventional method of generating check matrixes for LDPC codes, encoding and decoding using LDPC codes are explained first.

At the sending side, the encoder 101 generates a check matrix H using a certain method. Then, a generator matrix G is derived from the following condition.

G: k×n matrix (where k is information-length and n is code-word length)

$GH^T=0$ (where T is transposition)

The encoder 101 then receives a message $(m_1 \, m_2 \ldots m_k)$ of an information-length k, and generates a code-word C using the generator matrix G as follows:

$$C = (m_1 \, m_2 \, \ldots \, m_k)G$$
$$= (c_1 \, c_2 \, \ldots \, c_n)(\text{where } H(c_1 \, c_2 \, \ldots \, c_n)^T = 0).$$

The modulator 102 subjects the generated code-word C to digital modulation such as BPSK, QPSK or multi-valued QAM and transmits the resultant modulated signal.

At the receiving side, the demodulator 104 receives the modulated signal via the channel 103, and subjects it to a digital demodulation such as BPSK, QPSK or multi-valued QAM. The decoder 105 then subjects the LDPC-coded, demodulated result to an iterative decoding by "Sum-Product Algorithm" and provides an estimated result (corresponding to the original $m_1 \, m_2 \ldots m_k$).

Conventionally, check matrixes for the LDPC codes are generated as explained below. As the check matrix the LDPC code, for example, following matrix is proposed by Gallager (see Non-patent Literature 1, FIG. 14).

This matrix is a binary matrix of "1" and "0". Parts of "1" are hatched and parts of "0" are white. There are four "1"s in one row (hereinafter, "row weight"), and there are three "1"s in one column (hereinafter, "column weight"). All columns and rows have respective uniform weights. Thus, it is generally called "Regular-LDPC Code". In the Gallager's codes, as shown in FIG. 14, the matrix is divided into three blocks, for example, and the second and third blocks are subjected to random permutation.

Because the random permutation has no certain rule, it is required to execute a time-consuming search by computer to find codes with a better characteristic.

Euclidean geometry codes are such LDPC codes that exhibit a relatively stable and nice characteristic and can definitely generate a matrix without the use of the computer search. Y. Kou et al. have proposed a method using such Euclidean geometry codes. This method explains "Regular-LDPC Codes" consisting of regular ensembles (see Non-patent Literature 2).

A method of generating a check matrix for LDPC codes is herein proposed using Euclidean geometry codes $EG(2, 2^6)$ or a kind of finite geometric codes. This method achieves a characteristic that is located closely but 1.45 decibels away from the Shannon limit at an error rate of 10-4. FIG. 15 illustrates a configuration of Euclidean geometry codes $EG(2, 2^2)$, which has a structure of "Regular-LDPC Codes" with row and column weights of 4, 4.

Euclidean geometry codes $EG(m, 2^s)$ have a characteristic defined as follows

Code length: $n=2^{2s}-1$

Redundant bit length: $n-k=3^s-1$

Information length: $k=2^{2s}-3^s$

Minimum distance: $d_{min}=2^s+1$

Density: $r=2^s/(2^{2s}-1)$.

As can be seen from FIG. 15, Euclidean geometry codes have a structure with a cyclically sifted location of "1" in each row from an adjacent row. This structure can characteristically configure codes easily and definitely.

The check matrix generating method by Y. Kou et al. further includes changing row and column weights based on the Euclidean geometry codes to extend rows and columns, if required. For example, when a column weight in $EG(2, 2^2)$ is separated into halves, in the paper by Y. Kou et al., every other one of four weights located in one column is separated into two groups. FIG. 16 illustrates an exemplary regular separation of the column weight from 4 into 2.

On the other hand, Ludy et al. have reported that "Irregular-LDPC Codes" have a better characteristic than that of "Regular-LDPC Codes" (see Non-patent Literature 3). The "Irregular-LDPC Codes" represent such LDPC codes that have non-uniformity in either or both of row and column weights.

Richardson et al. have analyzed it theoretically (see Non-patent Literature 4) as well as Chung et al. (see Non-patent Literature 5).

In particular, Chung et al. analyze a "Sum-Product Algorithm" for LDPC codes, on the assumption that a log-likelihood-ratio (LLR) between an input and an output at an iterative decoder can be approximated in a Gaussian distribution, to derive a nice ensemble of row and column weights.

Non-patent Literature 1

R. G. Gallager, "Low-Density Parity-Check Codes", Cambridge, MA: MIT Press, 1963.

Non-patent Literature 2

Y. Kou, S. Lin, and M. P. C. Fossorier, "Low Density Parity Check Codes Based on Finite Geometries: A Rediscovery," ISIT 2000, pp. 200, Sorrento, Italy, Jun. 25 to 30, 2000.

Non-patent Literature 3

M. G. Luby, M. Mitzenmacher, M. A. Shokrollahi, and D. A. Spielman, "Improved Low-Density Parity-Check Codes Using Irregular Graphs and Belief Propagation," Proceedings of 1998 IEEE International Symposium on Information Theory, pp. 171, Cambridge, Mass., Aug. 16 to 21, 1998.

Non-patent Literature 4

T. J. Richardson and R. Urbanke, "The capacity of low-density parity-check codes under message-passing decoding," IEEE Trans. Inform. Theory, vol. 47, No. 2, pp. 599 to 618, February 2001.

Non-patent Literature 5

S.-Y. Chung, T. J. Richardson, and R. Urbanke, "Analysis of Sum-Product Decoding of Low-Density Parity-Check Codes Using a Gaussian Approximation," IEEE Trans. Inform. Theory, vol. 47, No. 2, pp. 657 to 670, February 2001:

In the conventional method of generating check matrixes for LDPC codes by Chung et al., however, the number of "1" points in a row (corresponding to a degree distribution of variable nodes later described) and the number of "1" points in a column (corresponding to a degree distribution of check nodes later described) are both employed. as variables to derive the degree distribution of variable nodes and the degree distribution of check nodes that can maximize the following equation (1) (rate: coding rate). In a word, a linear programming is employed to search an ensemble that minimizes a signal-to-noise ratio (SNR).

$$\text{rate} = 1 - \frac{\int_0^1 \rho(x)}{\int_0^1 \lambda(x)} \quad (1)$$

Therefore, a problem arises because a check matrix derived from the maximum of the "rate" has a flux and unstable characteristic. In addition, the conventional method of generating check matrixes for LDPC codes iteratively executes the derivation of the degree distribution of variable nodes and the derivation of the degree distribution of check nodes over certain times. Therefore, a problem arises because it takes time to some extent for searching.

The present invention has been achieved in consideration of the above problems, and accordingly has an object to provide a method and an apparatus for generating a check matrix of a satisfactory performance for the an LDPC code capable of easily searching a definite and characteristic stabilized check matrix for the LDPC code corresponding to an optional ensemble.

DISCLOSURE OF THE INVENTION

A method of generating a check matrix for a low-density parity-check code in which at least one of weights of a column and a row are not uniform, using a Euclidean geometry code, according to one aspect of the present invention includes determining a code length and a coding rate; selecting the Euclidean geometry code that becomes a base; rearranging the Euclidean geometry code selected, based on a specific relational equation to create a basic matrix; selecting a maximum value of the weight of the column that satisfies a condition of "2<maximum value of the weight of the column≦number of 1s within columns in the Euclidean geometry code"; searching provisionally an ensemble of the weights of the row and the column weights of the low-density parity-check code via optimization based on Gaussian approximation in a state that number of the weights of the row are limited to continuous two kinds to determine an optimum set of the weights of the row; deleting the rows sequentially from a bottom of the basic matrix considering number of rows after a division; searching provisionally an ensemble of the weights of the row and the column of the low-density parity-check code via optimization based on Gaussian approximation, using the set of the weights of the row as a fixed parameter, to determine an optimum set of the weights of the column; searching an optimal ensemble of the weights of the row and the column of the low-density parity-check code via optimization based on Gaussian approximation, using the set of the weights of the row and the column as a fixed parameter; and dividing at random the weights of the row and the column of the basic matrix after deleting the rows in a predetermined procedure based on a final ensemble.

According to the method according to the present invention the specific relational equation used at the rearranging is generated such that the weights within the matrix are arranged at a higher position within columns.

A method of generating a check matrix for a low-density parity-check code in which at least one of weights of a column and a row are not uniform, using a Cayley graph, according to another aspect of the present invention includes determining a code length and a coding rate; determining the weights of the row and the column in the Cayley graph, which becomes a base, to create a basic matrix; selecting a maximum value of the weight of the column that satisfies a condition of "2<maximum value of the weight of the column≦number of 1s within columns in the Cayley graph"; searching provisionally an ensemble of the weights of the row and the column weights of the low-density parity-check code via optimization based on Gaussian approximation in a state that number of the weights of the row are limited to continuous two kinds to determine an optimum set of the weights of the row; deleting the rows sequentially from a bottom of the basic matrix considering number of rows after a division; searching provisionally an ensemble of the weights of the row and the column of the low-density parity-check code via optimization based on Gaussian approximation, using the set of the weights of the row as a fixed parameter, to determine an optimum set of the weights of the column; searching an optimal ensemble of the weights of the row and the column of the low-density parity-check code via optimization based on Gaussian approximation, using the set of the weights of the row and the column as a fixed parameter; and dividing at random the weights of the row and the column of the basic matrix after deleting the rows in a predetermined procedure based on a final ensemble.

According to the method according to the present invention, in the Gaussian approximation, the optimal ensemble of the weights of the row and the column, which minimizes a threshold, is searched in a single linear programming such that a Gaussian noise becomes maximum in a state that the coding rate is fixed.

According to the method according to the present invention, at the searching the optimum ensemble of the row and the column of the low-density parity-check code, a weight distribution in the ensemble is adjusted such that a total number of the weights in weight unit is equal to an integer and a sum of the total number of the weights in the weight unit is equal to a total number of 1s in the Euclidean geometry code. At the dividing, the dividing is performed based on the ensemble after an adjustment.

According to the method according to the present invention, wherein at the dividing, a Latin square of basic random sequence is generated, and a weight of 1 is extracted from each of the rows and each of the columns in the basic matrix after deleting the row, thereby dividing each of the rows and each of the columns at random based on the Latin square.

An apparatus for generating a check matrix for a low-density parity-check code in which at least one of weights of a column and a row are not uniform, using a Euclidean geometry code, according to still another aspect of the present invention includes a code-length/coding-rate determining unit that determines a code length and a coding rate; a Euclidean geometry code selecting unit that selects the Euclidean geometry code that becomes a base; a rearranging unit that rearranges the Euclidean geometry code selected, based on a specific relational equation to create a basic matrix; a maximum-weight selecting unit that selects a maximum value of the weight of the column that satisfies a condition of "2<maximum value of the weight of the column≦number of 1s within columns in the Euclidean geometry code"; a first weight searching unit that searches provisionally an ensemble of the weights of the row and the column weights of the low-density parity-check code via optimization based on Gaussian approximation in a state that number of the weights of the row are limited to continuous two kinds to determine an optimum set of the weights of the row; a deleting unit that deletes the rows sequentially. from a bottom of the basic matrix considering number of, rows after a division; a second searching unit that searches provisionally an ensemble of the weights of the row and the column of the low-density parity-check code via optimization based on Gaussian approximation, using the set of the weights of the row as a fixed parameter, to determine an optimum set of the weights of the column; a third searching unit that searches an optimal ensemble of the weights of the row and the column of the low-density parity-check code via optimization based on Gaussian approximation, using the set of the weights of the row and the column as a fixed parameter; and a dividing unit that divides at random the weights of the row and the column of the basic matrix after deleting the rows in a predetermined procedure based on a final ensemble.

An apparatus for generating a check matrix for a low-density parity-check code in which at least one of weights of a column and a row are not uniform, using a Cayley graph, according to still another aspect of the present invention includes a code-length/coding-rate determining unit that determines a code length and a coding rate; a Cayley-graph determining unit that determines the weights of the row and the column in the Cayley graph, which becomes a base, to create a basic matrix; a maximum-weight selecting unit that selects a maximum value of the weight of the column that satisfies a condition of "2<maximum value of the weight of the column≦number of 1s within columns in the Catley graph"; a first weight searching unit that searches provisionally an ensemble of the weights of the row and the column weights of the low-density parity-check code via optimization based on Gaussian approximation in a state that number of the weights of the row are limited to continuous two kinds to determine an optimum set of the weights of the row; a deleting unit that deletes the rows sequentially from a bottom of the basic matrix considering number of rows after a division; a second searching unit that searches provisionally an ensemble of the weights of the row and the column of the low-density parity-check code via optimization based on Gaussian approximation, using the set of the weights of the row as a fixed parameter, to determine an optimum set of the weights of the column; a third searching unit that searches an optimal ensemble of the weights of the row and the column of the low-density parity-check code via optimization based on Gaussian approximation, using the set of the weights of the row and the column as a fixed parameter; and a dividing unit that divides at random the weights of the row and the column of the basic matrix after deleting the rows in a predetermined procedure based on a final ensemble.

BRIEF DESCRIPTION OF THE DRAWINGS

FIG. 4 is a diagram of an ensemble (provisional) of a generator function $\lambda(x)$ and a generator function $\rho(x)$ after weights are distributed;

FIG. 5 is a diagram of an ensemble (provisional) of a generator function $\lambda(x)$ and a generator function $\rho(x)$ after weights are distributed;

FIG. 6 is a diagram of an ensemble (provisional) of a generator function $\lambda(x)$ and a generator function $\rho(x)$ after weights are distributed;

FIG. 7 is a diagram of one example of a weight distribution adjusting table;

FIG. 8 is a diagram of an ensemble of a final generator function $\lambda(x)$ and a final generator function $\rho(x)$ after the ensemble shown in FIG. 6 is adjusted;

FIG. 9 is a diagram of a conventional dividing procedure according to a research paper;

FIG. 10 is a diagram of a basic random sequence C (i) and a permutation pattern $LB_j$ (i) of the basic random sequence;

FIG. 11 is a diagram of a Latin square matrix $L_{jq}(i)$;

Figures 15, 16:
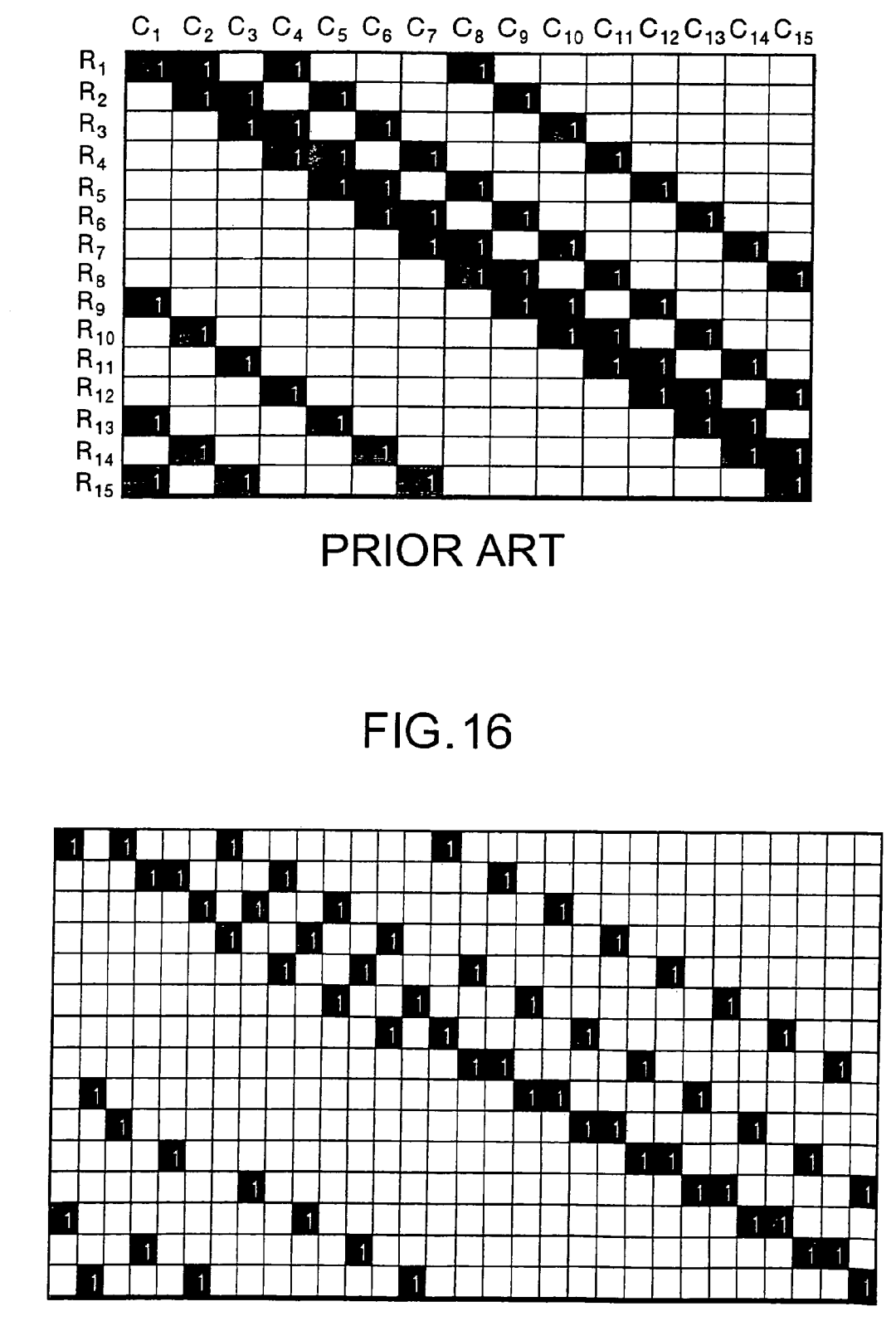

FIG. 15 is a diagram of a configuration of Euclidean geometry codes EG(2, $2^2$); and FIG. 16 is an exemplary row weight regularly separated from 4 into 2.

BEST MODE FOR CARRYING OUT THE INVENTION

The present invention will be explained in detail with reference to the accompanying drawings.

Figure 1:
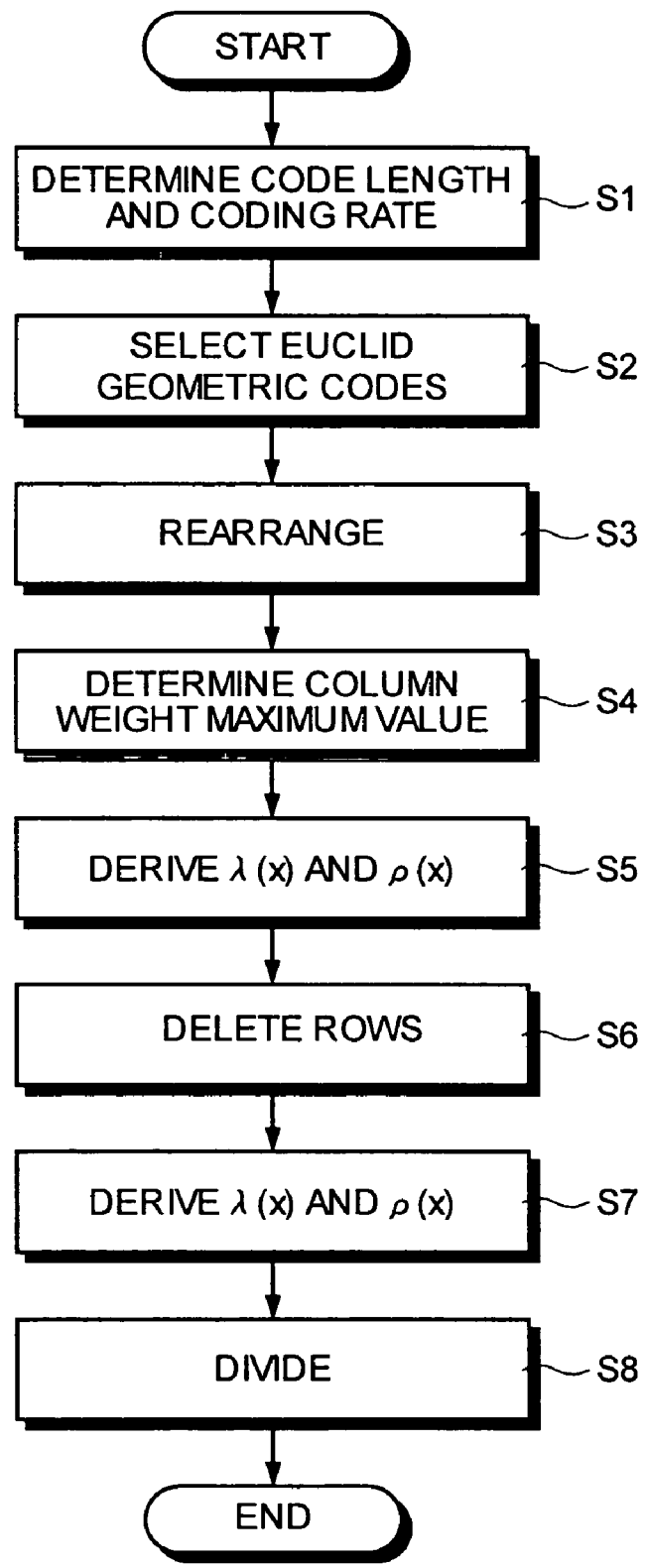
FIG. 1 is a flowchart of a method of generating check matrixes for LDPC codes according to the present invention.

FIG. 1 is a flowchart of a method of generating check matrixes for LDPC codes according to the present invention. The method of generating check matrixes for LDPC codes according to the present embodiment can be executed within a communication apparatus according to a set parameter, or can be executed by other control unit at the outside of the communication apparatus (such as a computer). When the method of generating check matrixes for LDPC codes according to the present embodiment is executed at the outside of the communication apparatus, generated check matrixes for LDPC codes are stored into the communication apparatus. In the following embodiment, the above method is executed within the communication apparatus for the convenience of explanation.

Figure 13:
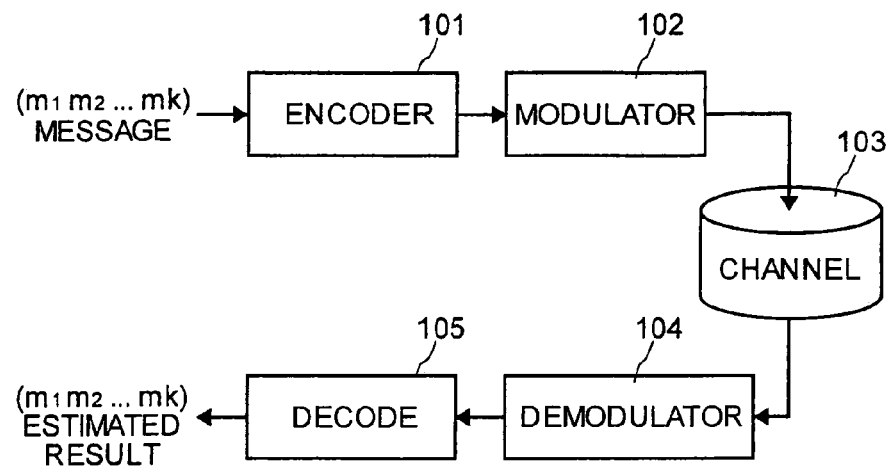
FIG. 13 is a diagram of an LDPC encoding/decoding system.
Figure 14:
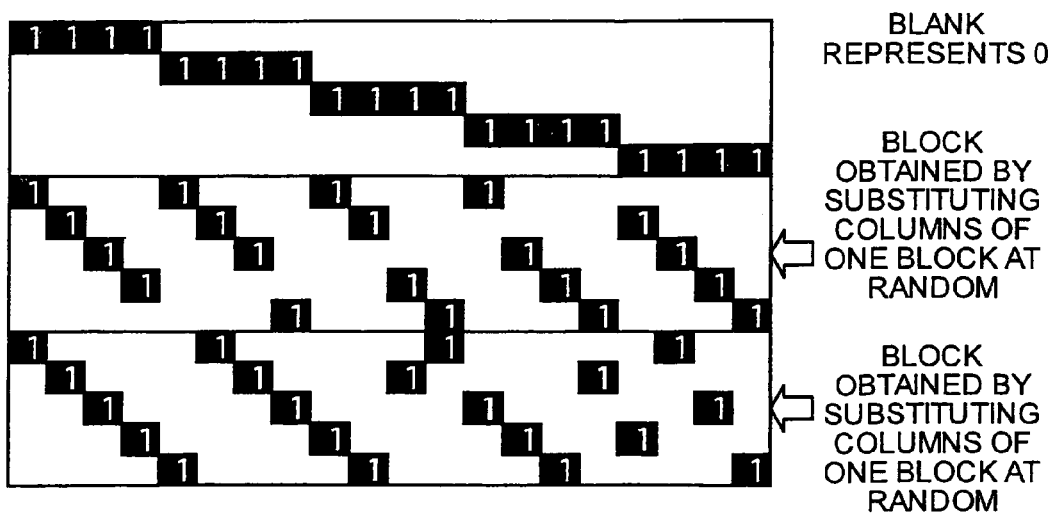
FIG. 14 is a diagram of a conventional check matrix for LDPC codes.

Prior to explanation of the method of generating check matrixes for LDPC codes according to the present embodiment, the positions of an encoder and a decoder capable of achieving the method is explained first together with the conventional method of generating check matrixes for "Irregular-LDPC Codes". The LDPC encoding/decoding system has the same configuration as that previously explained in FIG. 13.

At the sending side, the encoder 101 generates a check matrix H using the method of generating check matrixes for LDPC codes according to the present embodiment later described. Then, a generator matrix G is derived from the following condition.

G:k×n matrix (where k is information-length and n is code-word length)

G$H^T$=0 (where T is transposition)

The encoder 101 then receives a message (m$_1$ m$_2$ ... m$_k$) of an information-length k, and generates a code-word C using the generator matrix G.

$$C = (m_1\ m_2\ \ldots\ m_k)G$$
$$= (c_1\ c_2\ \ldots\ c_n)(\text{where } H(c_1\ c_2\ \ldots\ c_n)^T = 0).$$

The modulator 102 subjects the generated code-word C to digital modulation such as BPSK, QPSK or multi-valued QAM and transmits the resultant modulated signal.

At the receiving side, the demodulator 104 receives the modulated signal via the channel 103, and subjects it to a digital demodulation such as BPSK, QPSK or multi-valued QAM. The decoder 105 then subjects the LDPC-coded, demodulated result to an iterative decoding by "Sum-Product Algorithm" and provides an estimated result (corresponding to the original m1 m2 ... mk).

Chung et al. (S. -Y. Chung, T. J. Richardson, and R. Urbanke, "Analysis of Sum-Product Decoding of Low-Density Parity-Check Codes Using a Gaussian Approximation," IEEE Trans. Inform. Theory, vol. 47, No. 2, pp. 657 to 670, February 2001.) have theoretically analyzed the conventional method of generating check matrixes for "Irregular-LDPC Codes". The method is explained here in detail. In this method, a "Sum-Product Algorithm" for LDPC codes is analyzed, on the assumption that a Log Likelihood Ratio (LLR) between an input and an output at an iterative decoder can be approximated in a Gaussian distribution, to derive a nice ensemble of row and column weights.

The method of generating check matrixes for LDPC Codes described in the paper, or Gaussian Approximation, has a premise that defines a point of "1" on a row as a variable node and a point of "1" on a column as a check node in the check matrix.

LLR message propagation from a check node to a variable node is analyzed first. The following equation (2) is defined on condition that 0<s<∞ and 0≦t<∞. In this case, s=mu0 denotes a mean of u0; u0 a Log Likelihood Ratio (LLR) associated with a signal received via a channel containing a Gaussian noise of distributed value σn2; and t an ensemble average of LLR output values at check nodes at the time of certain iteration.

$$f_j(s, t) = \phi^{-1}\left(1 - \left[1 - \sum_{i=2}^{d_i} \lambda_i \phi(s + (i-1)t)\right]^{j-1}\right) \quad (2)$$

$$f(s, t) = \sum_{j=2}^{d_r} \rho_j f_j(s, t)$$

λ(x) and ρ(x) respectively denote generator functions of degree distribution associated with variable nodes and check nodes, and can be represented by the equations (3) and (4). (A degree is expressed as the number of "1"s in each row and each column of variable nodes and check nodes). In addition, λi and ρi respectively denote ratios of edges belonging to variable nodes and check nodes at a degree of i. Finally, dl denotes a degree of maximum variable nodes, and d$_r$ a degree of maximum check nodes.

$$\lambda(x) = \sum_{i=2}^{d_l} \lambda_i x^{i-1} \quad (3)$$

$$\rho(x) = \sum_{i=2}^{dr} \rho_i x^{i-1} \quad (4)$$

φ(x) is defined as the following equation (5)

$$\phi(x) = \begin{cases} 1 - \frac{1}{\sqrt{4\pi x}} \int_R \tanh\frac{u}{2} \cdot e^{-\frac{(u-x)^2}{4x}} du & \text{if } x > 0 \\ 1 & \text{if } x \leq 0 \end{cases} \quad (5)$$

The equation (2) can be represented equivalently by the following equation (6)

$$t_l = f(s, t_{l-1}) \quad (6)$$

where t$_l$ denotes an ensemble average of LLR output values on check nodes at the time of the l-th iteration.

A condition required for deriving an SNR limit (threshold) that provides an error with a value of 0 includes t$_1$(s)→∞ (expressed as R+) when 1→∞. In order to satisfy this condition, it is required to satisfy the following conditional expression (7):

$$t < f(s, t), \text{ all } t \in R+ \quad (7)$$

LLR message propagation from a check node to a variable node is analyzed next. The following equation (8) is defined on condition that 0<s<∞ and 0<r≦1. In this case, r has an initial value r0 of φ(s).

$$h_i(s, r) = \phi\left(s + (i-1)\sum_{j=2}^{d_r} \rho_j \phi^{-1}(1 - (1-r)^{j-1})\right) \quad (8)$$

$$h(s, r) = \sum_{i=2}^{d_i} \lambda_i h_i(s, r)$$

The equation (8) can be represented equivalently by the following equation (9)

$$r_l = h(s, r_{l-1}) \quad (9)$$

A condition required for deriving an SNR limit (threshold) that provides an error with a value of 0 includes r$_l$(s)→0. In order to satisfy this condition, it is required to satisfy the following conditional expression (10)

$$r < h(s, r), \text{ all } r \in (0, \phi(s)) \quad (10)$$

In the paper by Chung et al., optimal degrees are searched for variable nodes and check nodes using the above equation in the following procedure (Gaussian approximation):

(1) On the assumption that a generator function λ(x) and a Gaussian noise σn are given, a generator function ρ(x) is used as a variable to search a point that maximizes the equation (1) previously described. A constraint condition associated with this search includes normalization to ρ(x)=1 and satisfaction of the equation (7);

(2) On the assumption that a generator function ρ(x) and a Gaussian noise σn are given (as a value resulted from the step (1), for example), a generator function λ(x) is used as a variable to search a point that maximizes the equation (1). A constraint condition associated with this search includes normalization to λ(x)=1 and satisfaction of the equation (10);

(3) In order to find the maximum "rate", the steps (1) and (2) are iteratively executed to search a better ensemble of the generator function λ(x) and the generator function ρ(x) with a linear programming; and (4) Finally, signal power is normalized to 1 based on Gaussian noise σn to find an SNR limit (threshold).

$$\text{threshold (dB)} = -10 * \log 10^{(2*\sigma_n^2)} \quad (11)$$

A problem is found in the paper of Chung et al. because a check matrix derived from the maximum of the "rate (coding rate)" is flux. Such the check matrix is not suitable for practical design because the rate fixed in design as a spec varies. In addition, a problem is found in the paper of Chung et al. that it takes time to carry out a search processing because the derivation of the degree distribution associated with variable nodes and the derivation of the degree distribution associated with check nodes are executed over certain times. Further, it is difficult to easily cope with an optional ensemble, an optional code length, and an optional coding rate.

Therefore, a method of easily searching in a short time a definite and characteristic-stabilized check matrix for "Irregular-LDPC Codes" corresponding to an optional ensemble, an optional code length, and an optional coding rate according to the present embodiment, will be explained (see FIG. 1). Specifically, a check matrix for "Irregular-LDPC Codes" is generated by dividing or deleting the arrangement of "1s" in one row or one column in Euclidean geometry codes. FIG. 1 is a flowchart of the method of generating check matrixes for LDPC codes according to a first embodiment of the present invention.

According to the method of generating check matrixes for LDPC codes according to the present embodiment, a code length N and a coding rate are determined (step S1). As a result, the size of the check matrix is determined as N×M. M can be expressed as N×(1−rate). Therefore, when N=6000, and rate=0.5, for example, M=6000×0.5=3000.

Next, Euclidean geometry codes EG(2, $2^s$) that become a base of the check matrix for "Irregular-LDPC Codes" are selected (step S2). A row weight and a column weight become $2^s$ respectively.

The selected Euclidean geometry codes EG(2, $2^s$) are rearranged such that 1 within a column is at a higher position of the column as far as possible (step S3). The order of this rearrangement is generally expressed as shown in the following equation (12) when $h^k(X) \in$ Galois Field ($2^{2s}$), and k={1, 2, . . . , ($2^{2s}$−1)}.

$$\begin{bmatrix} h_{i+0}(X) \\ h_{i+1}(X) \\ h_{i+2}(X) \\ \vdots \\ h_{i+(2^s-1)}(X) \end{bmatrix} = \begin{bmatrix} 1 \\ X^{-w1} \\ X^{-w2} \\ \vdots \\ X^{-w(2^s-1)} \end{bmatrix} \times \left[ (1 + X^{w1} + X^{w2} + \ldots + X^{w(2^s-1)}) \cdot X^{(i-1)} \right] \quad (12)$$

where i=1 to $2^{2s}$−1. The polynomial within (·) of the equation (12) denotes a first row of the Euclidean geometry codes EG(2, $2^s$).

When $h_i(X)=h_j(X)$ is present in i=1 to $2^{2s}$−1 and j=1 to i−1, $h_i(X)$ is deleted. When a row delete processing described later (at step S6) is carried out by this rearrangement, a column having a largest weight possible can be left, and a variation of weight within the column can be minimized.

Figure 2:
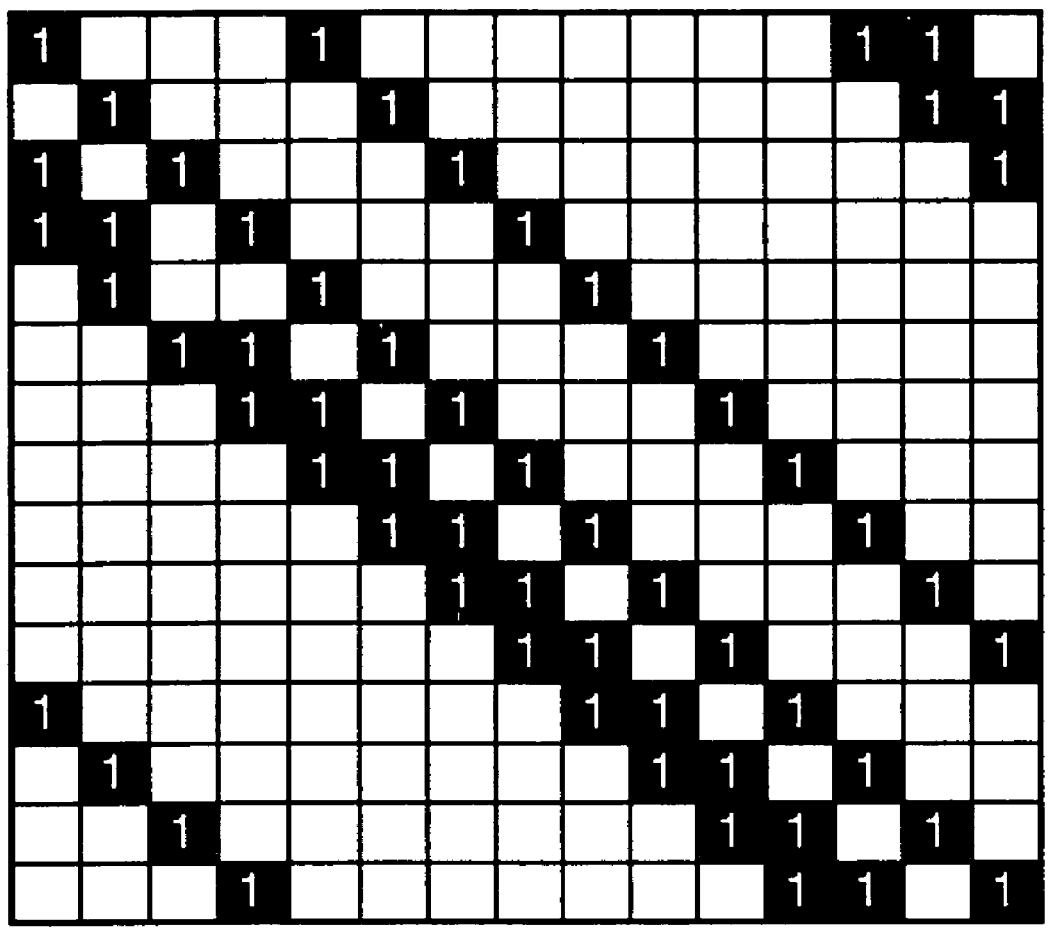
FIG. 2 is a diagram of a matrix of selected Euclidean geometry codes EG(2, $2^2$)
Figure 3:
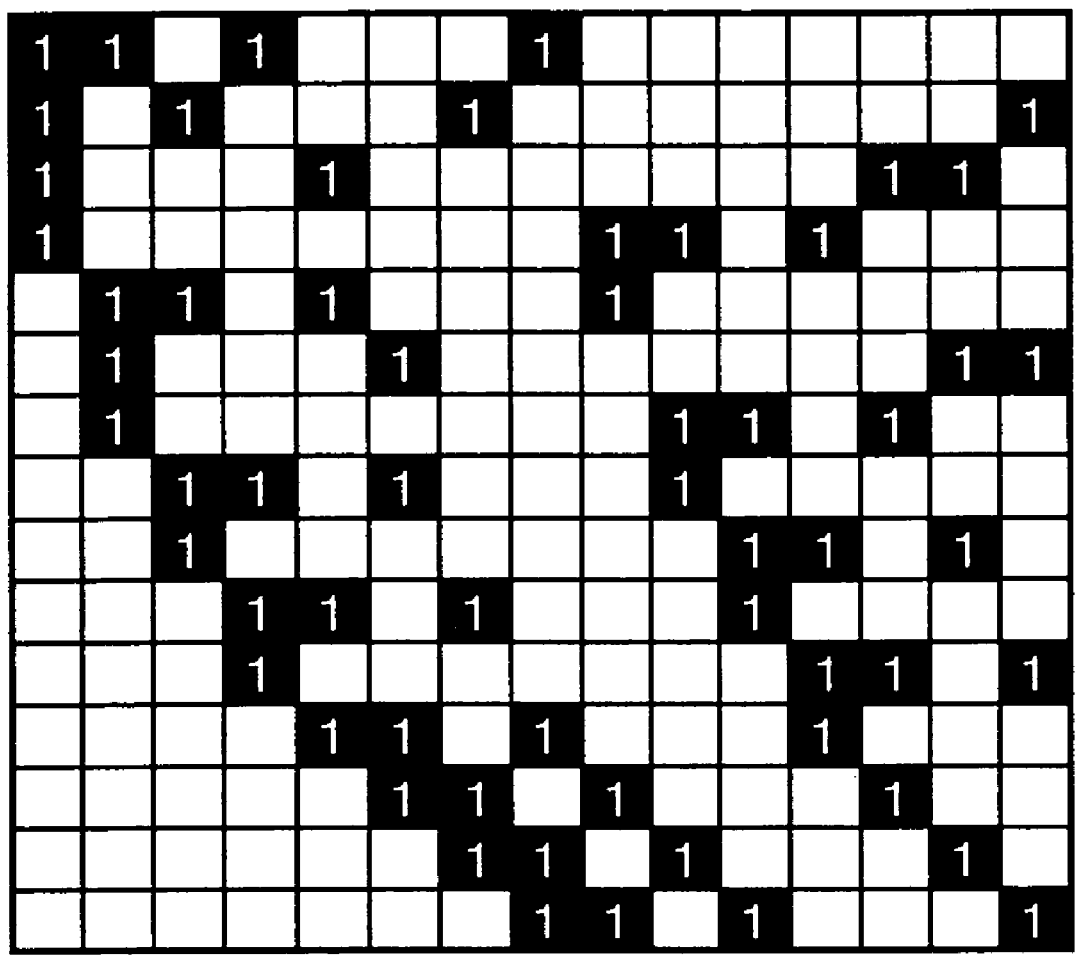
FIG. 3 is a diagram of a matrix after a rearrangement (i.e., basic matrix)

For example, when s=2, that is, when Euclidean geometry codes EG(2, $2^2$) is selected, the implementation of the above rearrangement procedure causes the matrix shown in FIG. 2 to be rearranged to a matrix shown in FIG. 3. FIG. 2 is a diagram (where blank designates 0) of the matrix of Euclidean geometry codes EG(2, $2^s$) selected at step S2, and FIG. 3 is a diagram of the matrix (basic matrix) after the rearrangement.

Next, a largest weight of a column $\gamma_1$ ($2<\gamma_1 \leq 2^s$) is selected (step S4). In the coding/decoding using LDPC codes, generally when the number of "cycle 4" and "cycle 6" is as small as possible on a binary graph, satisfactory characteristics can be obtained. Therefore, LDPC codes having a construction of restricting the occurrence of a small number of "cycle 4" and "cycle 6" is preferable. Euclidean geometry codes do not have "cycle 4". Therefore, decoding characteristics are improved by deleting "cycle 6". For example, in the case of Euclidean geometry codes EG(2, $2^5$), it is generally known that the number of "cycle 6" decreases when the weight is about 12, and satisfactory characteristics are obtained. In the example, $\gamma_1$=12 is selected. Although, $\gamma_1$=12 is selected in this example, other number can be selected when the above condition is satisfied.

Next, an ensemble of "Irregular-LDPC codes" based on a requested coding rate is provisionally obtained using optimization according to Gaussian Approximation (step S5). A generator function ρ(x) of a weight distribution of row is set as $\rho(x)=\rho_j x^{j-1}+(1-\rho_j)x^j$, where j is an integer of j≧2.

A parameter set $\{\mu_1, \mu_2\}$ that satisfies the following equation (13) is selected (step S5), where $2 \leq \mu_i \leq 2^s$, and i∈{1, 2}.

$$b_1 \mu_1 + b_2 \mu_2 = 2^s \quad (13)$$
$$\arg \cdot \min |\rho\_\mu_i - \rho'\_\mu_i|$$
$$\rho'\_\mu_i = \frac{\mu_i \times b_i}{2^s}$$

where bi and i are nonnegative integers, $\mu_i$ denotes a row weight, and $\rho\_\mu_i'$ denotes an edge ratio belonging to the weight $\mu_i$ that is matched with "Irregular-LDPC codes". In this example, $\mu_1$=8 and $\mu_2$=8 are selected as parameter sets. FIG. 4 is a diagram of an ensemble (provisional) of a generator function λ(x) and a generator function ρ(x) after weights are distributed when $\gamma_1=d_l=12$, and rate=0.5, where x denotes a weight, and $\lambda_x$ and $\rho_x$ represent weight distributions of variable nodes and check nodes respectively. In the table, $\sigma_{GA}$ denotes a noise distribution value on the "threshold" derived by Gaussian Approximation; $SNR_{norm}$(GA) denotes a difference between an SNR on the "threshold" derived by Gaussian Approximation and an SNR on Shannon limit.

Steps of executing Gaussian Approximation according to the present embodiment for searching an ensemble of a generator function λ(x) of a degree distribution of variable nodes and a generator function ρ(x) of a degree distribution of check nodes will be explained.

(1) A coding rate "rate" is fixed (step S1).

(2) A generator function λ(x) and a generator function ρ(x) are simultaneously used as variables, and a linear programming is employed to search optimal generator functions λ(x) and ρ(x) that maximize the Gaussian noise σn. A constraint condition associated with this search includes normalization to $\lambda(1)=1$, $\rho(1)=1$ and satisfaction of the equation (10).

Thus, according to the present embodiment, the linear programming is employed once to find such generator functions $\lambda(x)$ and $\rho(x)$ that satisfy the equations (9) and (10). Therefore, it is possible to search a definite and characteristic-stabilized check matrix for LDPC codes more easily in a shorter time than the method described in the above paper (Chung, et. al.) that iteratively executes derivation of the generator functions $\lambda(x)$ and $\rho(x)$ to derive both optimal values.

When a number of rows is M' after a row division processing (step S8) explained later is executed following $b_1$, $b_2$, $\mu_1$, and $\mu_2$ obtained at steps S5, the rows of the number shown in the following equation (14) are deleted in order from the bottom of the basic matrix shown in FIG. 3 (step S6). As a result, the weight set of columns of the matrix after the deletion becomes $\{d_1, d_2, \ldots, d_\alpha\}$.

$$\frac{M'-M}{b_1+b_2} \quad (14)$$

Next, an ensemble of "Irregular-LDPC Codes" based on a requested coding rate is provisionally obtained using optimization by Gaussian approximation according to the present embodiment and using $\mu_i$, $\mu_2$, $\rho\_\mu_i'$, and $\rho\_\mu_2'$ as fixed parameters (step S7). For a specific column, when the number of column weight x becomes smaller than 1, this weight is deleted from the candidate. FIG. 5 is a diagram of an ensemble (provisional) of a generator function $\lambda(x)$ and a generator function $\rho(x)$ after weights are distributed when $\gamma_1=d_i=12$, and rate=0.5.

A set $\{\gamma_1, \gamma_2, \ldots, \gamma_1\}$ of column weight candidates that satisfies the above weight distribution and satisfies the following equation (15) is selected (step S7), where $\gamma_1 \leq 2^s$. When there is a weight of column that does not satisfies the following equation (15), this column weight is deleted from the candidates.

$$\begin{bmatrix} a_{1,1}^{(d\_\beta)} & a_{1,1}^{(d\_\beta)} & \cdots & a_{1,1}^{(d\_\beta)} \\ a_{1,1}^{(d\_\beta)} & a_{1,1}^{(d\_\beta)} & \cdots & a_{1,1}^{(d\_\beta)} \\ \vdots & \vdots & \ddots & \vdots \end{bmatrix} \begin{bmatrix} \gamma_1 \\ \gamma_2 \\ \vdots \\ \gamma_l \end{bmatrix} = \begin{bmatrix} d\_\beta \\ d\_\beta \\ \vdots \\ d\_\beta \end{bmatrix} \quad (15)$$

In the above equation, each a denotes a nonnegative integer coefficient of $\{\gamma_1, \gamma_2, \ldots, \gamma_1\}$ that constitutes a column weight $d\_\beta$ ($\beta=\{1, 2, \ldots, \alpha\}$, i and j are positive integers, $\gamma_i$ denotes a column weight, and $\gamma_1$ denotes a largest weight of column.

Next, an ensemble of "Irregular-LDPC Codes" based on a requested coding rate is obtained using optimization by Gaussian approximation according to the present embodiment and using $\mu_i$, $\mu_2$, $\rho\_\mu_i'$, and $\rho\_\_{\mu_2}'$ and $\{\gamma_1, \gamma_2, \ldots, \gamma_1\}$ as fixed parameters (step S7). FIG. 6 is a diagram of an ensemble of a generator function $\lambda(x)$ and a generator function $\rho(x)$ after weights are distributed when $\gamma_1=d_i=12$, and rate=0.5.

Prior to such the dividing process, the weight distributions in the ensemble of generator functions $\lambda(x)$ and $\rho(x)$ shown in FIG. 6 are subjected to adjustment in the following procedures.

The adjusting procedure will be explained using the example shown in FIG. 7 for the convenience of explanation, although FIG. 7 is not a table of the adjustment of weight distribution shown in FIG. 6. FIG. 7 is a diagram of one example of a weight distribution adjusting table.

(1) The ensemble of the generator functions $\lambda(x)$ and $\rho(x)$ (see Table 1) found through Gaussian Approximation is set in the table on the second column and the third column.

(2) The weight distributions $\lambda x$ and $\rho x$ (the third column) are multiplied by the total number of "1"s, TP=24000, in the entire matrix at EG(2, 25) to find the total weight number of weight units, and the total weight number of weight units and a sum thereof are set on the fourth column.

(3) The total weight number of weight units (on the fourth column) is divided by the corresponding weight of x to find the total column number of weight units, which is set on the fifth column.

(4) If the total column number of weight units contains a fraction after the decimal point, a rounding process (such as rounding off, rounding up, and rounding down) is performed, and the rounded result is set on the sixth column.

(5) The rounded total column number of weight units (on the sixth column) is multiplied by the corresponding weight of x to find the total column number of weight units after the rounding process, which is set on the seventh column. It is then determined whether each sum of the total column numbers (a total row on the seventh column) is equal to the total number "1"s in the matrix (TP=24000).

(6) If it is not equal to the total number of "1"s in the matrix, the rounded total column number of weight units (on the seventh column) is adjusted on an integer basis, and the adjusted result is set on the eighth column. In this case, the sum on the eighth column is adjusted to have a value equal to the total number of "1"s in the matrix (TP=24000).

(7) The adjusted total weight number of weight units (on the eighth column) is divided by the corresponding weight of x to find the adjusted total column number of weight units, which is set on the ninth column. Each adjusted weight distribution (on the eleventh column) is determined to have a value as close to the value found through Gaussian Approximation (on the third column) as possible.

The above adjusting procedure can be generally expressed as shown in the following equations (16), (17), and (18). A number of columns $n\_\gamma_i$ belonging to the weight $\gamma_i$ and a number of rows $n\_\rho_i$ belonging to the weight $\mu_i$ are obtained from the following equation (16), where $w_t$ denotes a total weight of matrixes after deleting rows.

$$n\_\gamma_i = \text{round}\left(w_t \times \frac{\lambda\_\gamma_i}{\gamma_i}\right), \quad n\_\mu_i = \text{round}\left(w_t \times \frac{\rho\_\mu_i}{\mu_i}\right) \quad (16)$$

The last number of columns $n\_\gamma_i'$ belonging to the weight $\gamma_i$ and the last number of rows $n\_\mu_i'$ belonging to the weight $\mu_i$ are obtained based on the following conditions ((the equations (17) and (18)). $\lambda\_\gamma_i'$ represents a ratio of columns belonging to the weight $\gamma_i'$ adjusted by matching the matrix after deleting rows, and $\rho\_\mu_i'$ represents a ratio of rows belonging to the weight $\mu_i'$ adjusted by matching the matrix after deleting rows.

$$n'\_\gamma_i = w_t \times \frac{\lambda'\_\gamma_i}{\gamma_i}, i = 1, 2, \ldots, 1 \quad (17)$$

$$\sum_{i=1}^{l} n'\_\gamma_i \cdot \gamma_i = w_t$$

$$\arg \cdot \min \sum_{i=1}^{l} |\lambda\_\gamma_i - \lambda'\_\gamma_i|$$

$$n'\_\mu_i = w_t \times \frac{\rho'\_\mu_i}{\mu_i}, i = 1, 2 \quad (18)$$

$$\sum_{i=1}^{2} n'\_\mu_i \cdot \mu_i = w_t$$

FIG. 8 is a diagram of an ensemble of a final generator function λ(x) and a final generator function ρ(x) at step S7 after the ensemble shown in FIG. 6 is adjusted in the following procedure.

Figure 9:
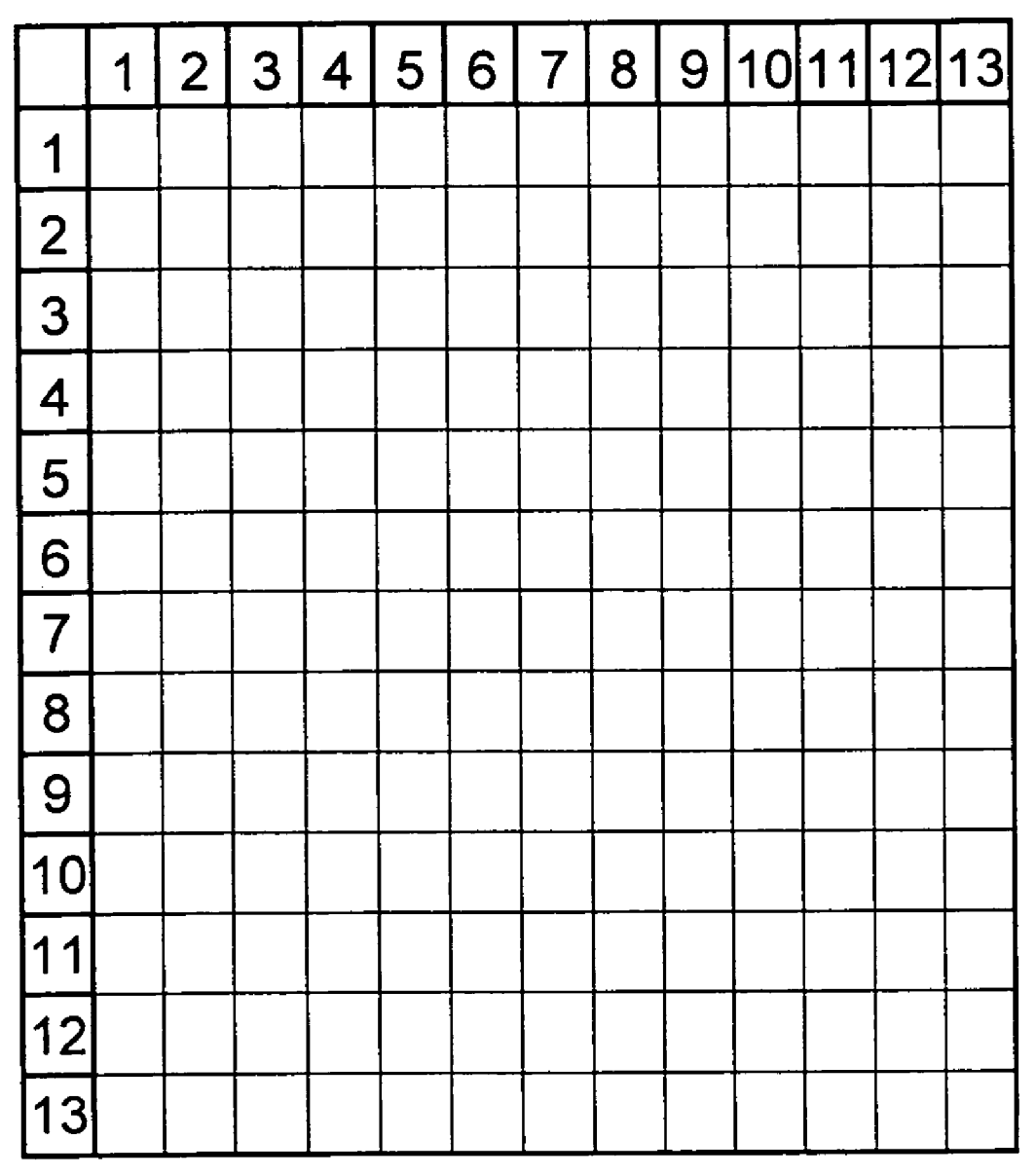

Lastly, a procedure of dividing one row or one column in Euclidean geometry codes (step S8) is explained. The paper of Y. Kou et al. proposes to perform the dividing based on certain rules. FIG. 9 illustrates the dividing procedure proposed in the paper of Kou et al. As shown in FIG. 9, a matrix is numbered with column numbers 1, 2, 3 . . . in sequence from the left end and row numbers 1, 2, 3 . . . in sequence from the top. For example, 32 points×1 row can be divided into 8 points×4 rows regularly in accordance with the following equation (12)

$$S_m(n) = B_l(m + 4*n) \quad (19)$$

where m=1, 2, 3, 4; n=0, 1, 2, 3, 4, 5, 6, 7; and l denotes a column number in EG(2, $2^5$). $B_l(x)$ denotes a position of "1" on the l-th column in EG(2, $2^5$), and Sm(n) a position of "1" on the m-th column in the divided matrix.

Specifically, a row number indicative of a position of "1" on a row in EG(2, $2^5$) is represented by $B_1(x)$={1 32 114 136 149 223 260 382 402 438 467 507 574 579 588 622 634 637 638 676 717 728 790 851 861 879 947 954 971 977 979 998}

As a result, extracting a number indicative of "1" from $B_l(x)$ regularly, row numbers indicative of positions of "1" on the 1st to 4th columns in the divided matrix are represented by $S_1(n)$={1 149 402 574 634 717 861 971}

$S_2(n)$={32 223 438 579 637 728 879 977}

$S_3(n)$={114 260 467 588 638 790 947 979}

$S_4(n)$={136 382 507 622 676 851 954 998}.

Thus, 32 points×1 row can be divided into 8 points×4 rows.

On the other hand, in the dividing procedure according to the present embodiment, Euclidean geometry codes are not divided regularly as described above. Rather, a number indicative of "1" is extracted from $B_l(x)$ at random. Any extracting process may be applied so long as it can retain randomness.

Accordingly, on the m-th column in the divided matrix, an exemplary position of "1", $R_m(n)$, is represented by $R_1(n)$={1 114 574 637 851 879 977 979}

$R_2(n)$={32 136 402 467 588 728 861 971}

$R_3(n)$={149 260 382 438 579 638 717 998}

$R_4(n)$={223 507 622 634 676 790 947 954}.

One example of the above random division, that is, the above "a dividing method using a Latin square of random sequences" will be explained in detail. A random sequence is generated easily and definitely for the random division. This method has an advantage because the sending side and the receiving side can generate the same random sequence. This is extremely important in a practical system. There is another advantage because a condition associated with code characteristics can be defined correctly.

(1) Creation of basic random sequences:

An example of random sequence creation is described below using Euclidean geometry codes EG(2, $2^5$) for convenience of explanation. In Euclidean geometry codes EG(2, $2^5$), the number of "1"s present in a row is equal to $2^5$=32.

When P is used for the minimum prime number that satisfies P≧$2^s$, for example, P=37 in the case of $2^5$. A basic random sequence C(i) with a sequence length, P−5=32, is created in accordance with the equation (20)

$C(1) = 1$ $C(i+1) = G0 \times C(i) \bmod P \quad (13)$ where i=1, . . . , P−1; and G0 denotes an original source of Galois Field GF(P). As a result, C(i) is represented by:

$C(i)$={1 2 4 8 16 32 27 17 34 31 25 13 26 15 30 23 9 18 36 35 33 29 21 5 10 20 3 6 12 24 11 22 7 14 28 19}

(2) Numbers larger than 32 are deleted such that a sequence length becomes $2^5$=32.

$C(i)$={1 2 4 8 16 32 27 17 31 25 13 26 15 30 23 9 18 29 21 5 10 20 3 6 12 24 11 22 7 14 28 19}

(3) A skip interval S(j) is defined as shown in the following equation (21) in order to read the basic random sequence at a constant interval.

$$S(j) = j, j = 1, 2, \ldots, 2^s \quad (21)$$

(4) A permutation pattern $LB^j(i)$ is generated based on the following equation (22).

$$LB^j(i) = ((S(j) \times i) \bmod P) + 1$$

$$j = 1, 2, \ldots, 2^s$$

$$i = 1, 2, \ldots, P-1 \quad (22)$$

Figure 10:
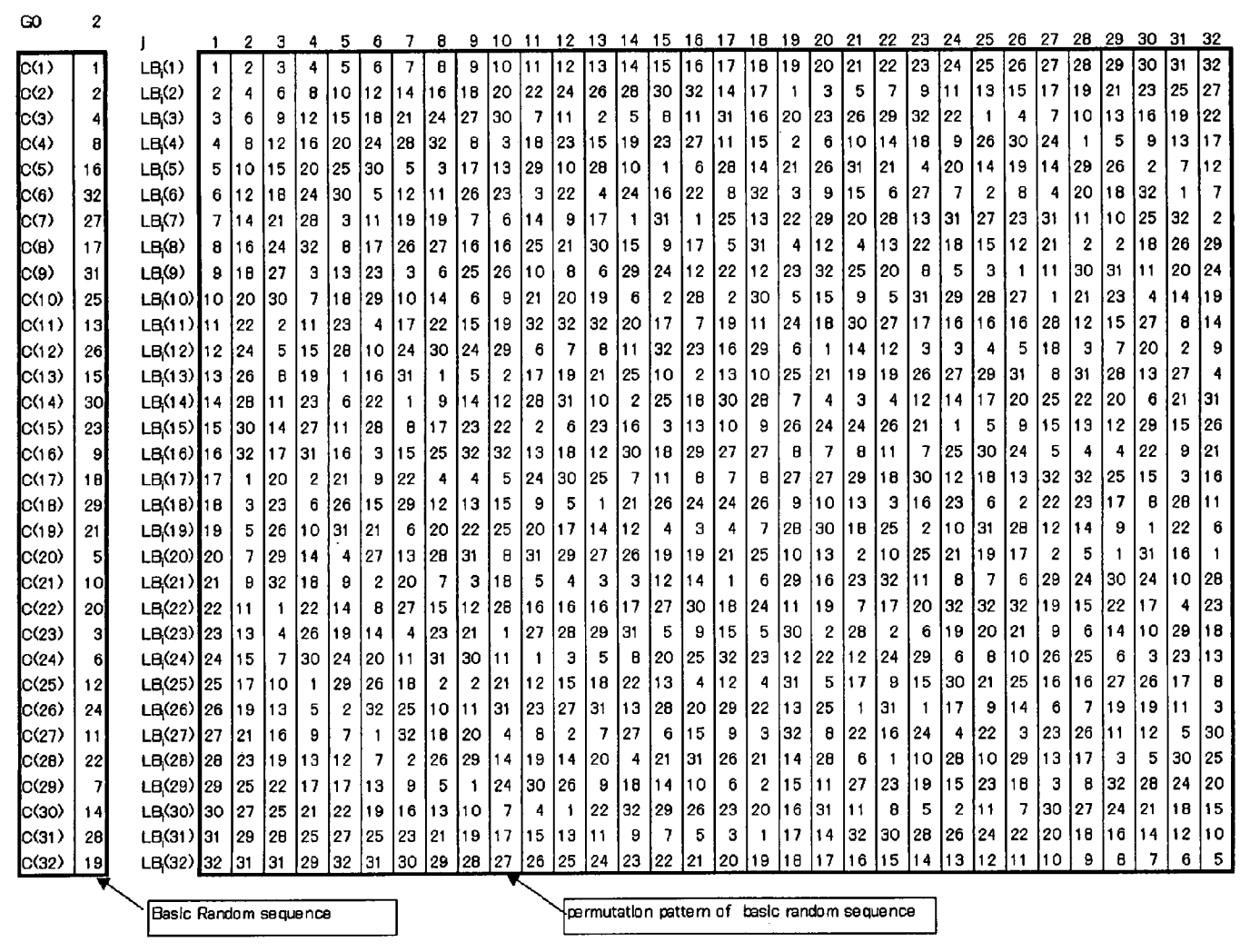

Numbers of $LB^j(i)$ larger than $2^s$ are deleted. FIG. 10 is a diagram of a basic random sequence C (i) and a permutation pattern $LB_j$ (i) of the basic random sequence.

(5) A Latin square matrix $L_{jq}(i)$ that is a j-th matrix of q columns and i rows is calculated based on the following equation (23), thereby executing a divide processing. In this case, when the column weight d_β is d_β<$2^s$ by the divide processing at step S6, numbers larger than d_β are thinned out from the elements of $L_{jq}(i)$.

$$L_{jq}(i) = LB_j(((q+i-2) \bmod 2^s)+1)$$

$$j = 1, 2, \ldots, 2^s$$

$$i = 1, 2, \ldots, 2^s$$

$$q = 1, 2, \ldots, 2^s \quad (23)$$

Figure 11:
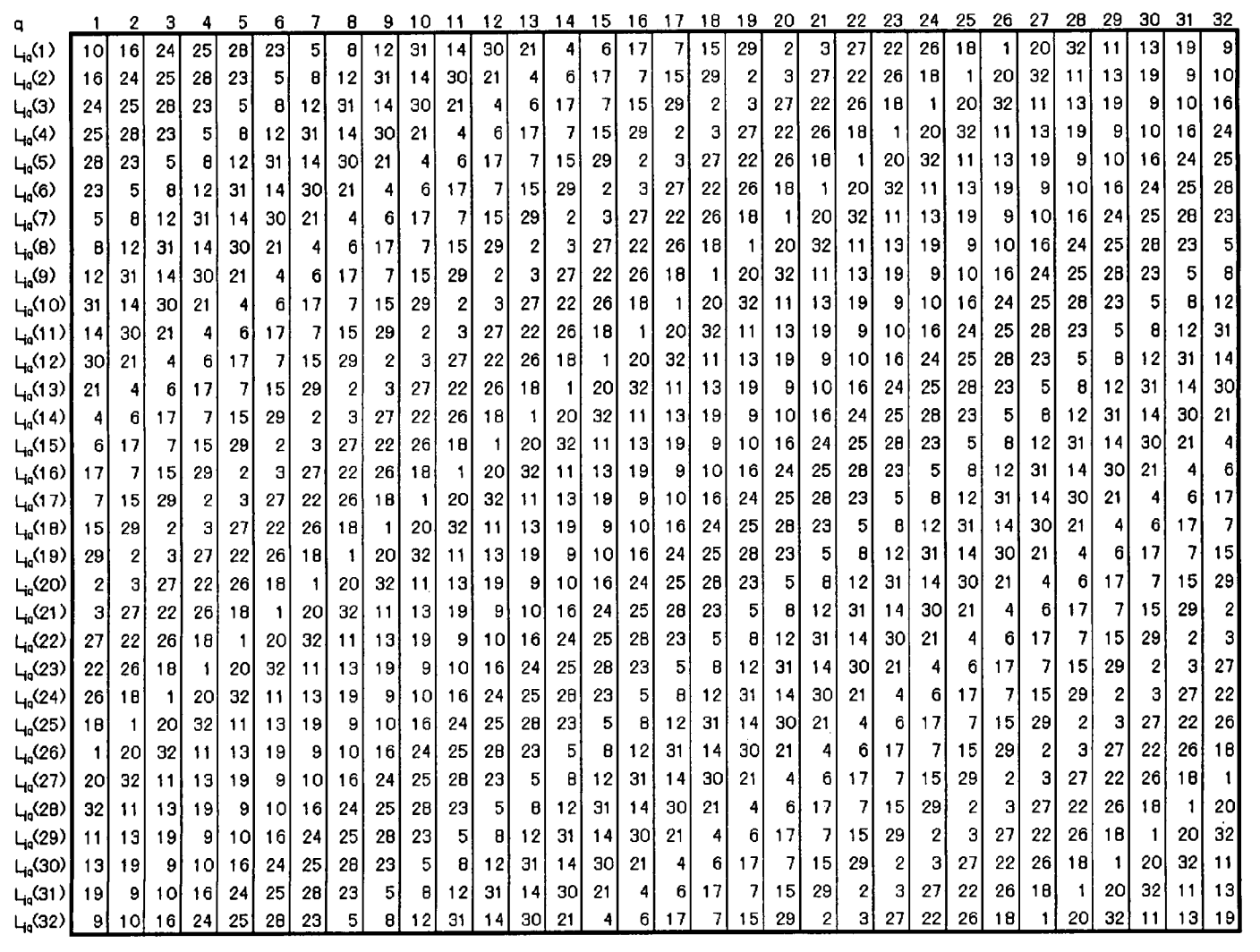

FIG. 11 is a diagram of a Latin square matrix $L_{jq}(i)$. This Latin square matrix $L_{jq}(i)$ is used to determine a j×32+q-th division pattern of a matrix to be expanded. For example, the 670-th column $g_{670}(1)=\{28\ 48\ 84\ 113\ 153\ 220\ 225\ 234\ 268\ 280\ 283\ 284\ 322\ 363\ 374\ 436\ 497\ 507\ 525\ 593\ 600\ 617\ 623\ 625\ 644\ 670\ 701\ 783\ 805\ 818\ 892\ 929\}$ of a shortened EG(2,25) by deletion is set to $g_{670}(1)$. This is divided into five columns of a weight 6 and one column of a weight 2. Because a corresponding Latin square $L_{jq}(i)$ becomes $L_{21,30}$ 20×32+ 30=670, $$L_{21,\ 31}=\{13\ 19\ 9\ 10\ 16\ 24\ 25\ 28\ 23\ 5\ 8\ 12\ 31\ 14\ 30\ 21\ 4\ 6\ 17\ 7\ 15\ 29\ 2\ 3\ 27\ 22\ 26\ 18\ 1\ 20\ 32\ 11\}$$

As a result, the divided patterns are as follows $$g_{670,1}(1) = g_{670}(L_{21,30}(1)) = \{322\ 525\ 268\ 280\ 436\ 625\}$$
$$i = 1, 2, \ldots, 6$$

$$g_{670,2}(1) = g_{670}(L_{21,30}(1)) = \{644\ 783\ 623\ 153\ 234\ 284\}$$
$$i = 7, 8, \ldots, 12$$

$$g_{670,3}(1) = g_{670}(L_{21,30}(1)) = \{892\ 363\ 818\ 600\ 113\ 220\}$$
$$i = 13, 14, \ldots, 16$$

$$g_{670,4}(1) = g_{670}(L_{21,30}(1)) = \{497\ 225\ 374\ 805\ 48\ 84\}$$
$$i = 17, 18, \ldots, 24$$

$$g_{670,5}(1) = g_{670}(L_{21,30}(1)) = \{701\ 617\ 670\ 507\ 28\ 593\}$$
$$i = 25, 26, \ldots, 30$$

$$g_{670,6}(1) = g_{670}(L_{21,30}(1)) = \{929\ 283\}$$
$$i = 31, 32$$

Figure 12:
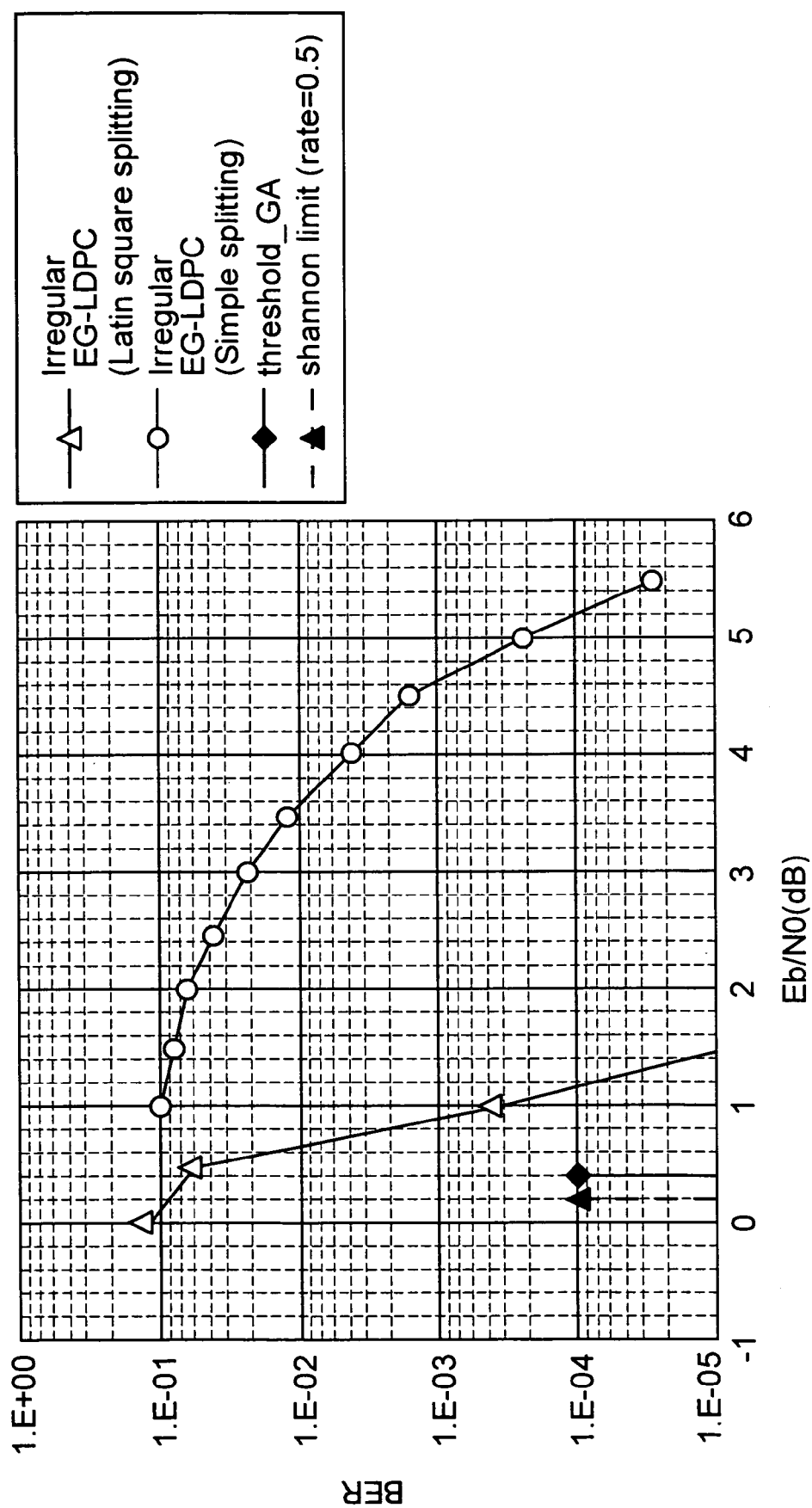
FIG. 12 is a diagram of a relation between Eb/No (a ratio of signal power to noise power per one information bit) and bit error rate (BER)

Characteristics of the LDPC codes previously described are compared below. FIG. 12 is a diagram of a relation between Eb/No (a ratio of signal power to noise power per one information bit) and bit error rate (BER). The decoding method is a "Sum-Product Algorithm". The characteristics use the ensemble shown in FIG. 8. FIG. 12 is a comparison of characteristics between a result of a regular division as described in a research paper by Y. Kou et al. and a result of executing a divide processing according to a Latin square in random sequence.

As is clear from FIG. 12, when the division method according to the present embodiment is used, the result of executing a divide processing according to a Latin square in random sequence comes close to about 1.2 decibel of Shannon limit. According to a regular division as described in a research paper by Y. Kou et al., a large improvement cannot be expected even with "Irregular-LDPC Codes". In contrast, the random division of the present embodiment can provide a remarkably improved performance when it is implemented because the probability of the occurrence of a loop decreases substantially.

As explained above, according to the present embodiment, first a code length and a coding rate are determined. Next, Euclidean geometry codes that become a base are determined. The selected Euclidean geometry codes are rearranged based on a specific relational equation to create a basic matrix. A maximum value of a column weight that satisfies the condition "$2<\gamma_1\leq 2^s$" is selected. In a state that row weights are limited to continuous two kinds, an ensemble of Irregular-LDPC codes is searched by Gaussian approximation. An optimum set of row weights is determined. Rows are deleted in order from the bottom of the basic matrix by considering the number of rows after a division. An ensemble of Irregular-LDPC codes is provisionally searched by Gaussian approximation using a set of row weights. An optimum set of column weights is determined. An optimal ensemble of Irregular-LDPC codes is searched by Gaussian approximation using the set of row weights and the set of column weights as fixed parameters. Finally, weights of the rows and columns of the basic matrix after deleting the rows are divided at random in a predetermined procedure based on this ensemble. As a result, a definite and characteristic-stabilized check matrix for "Irregular-LDPC Codes" corresponding to an optional ensemble, an optional code length, and an optional coding rate can be easily generated in a short time.

While Euclidean geometry codes are used to generate check matrix for "Irregular-LDPC Codes" according to the present embodiment, firm "Irregular-LDPC codes" can be constructed using a Cayley graph, for example. In this case, "processing of determining weights of rows and columns of the Cayley graph as a base, thereby creating a basic matrix" is executed in place of the above-explained "processing of selecting Euclidean geometry codes EG that become a base (step S2)" and "processing of rearranging the selected Euclidean geometry codes based on the equation (12), thereby creating a basic matrix (step S3)". Other processing are similar to the processing shown in FIG. 1.

Therefore, when the Cayley graph is used, a similar effect can be obtained by taking the same procedure as that explained above. A Magulis construction method and a Ramanujan graph construction method are available for the Cayley graph as shown in "J. Rosenthal, P. O. Vontobel, "Construction of LDPC codes using Ramanujan graphs and ideas from Margulis," in Proc. of the 38-th Allerton Conference on Communication, Control, Computing, 2000, pp. 248-257".

While Euclidean geometry codes or the Cayley graph are used for the basic matrix in the above explanation, other matrixes than Euclidean geometry codes such as projective geometric codes can be used so long as the matrixes satisfy conditions that "weights of rows and columns are constant" and "number of cycles is equal to or more than 6".

As explained above, according to one aspect of the present invention, first a code length and a coding rate are determined. Next, Euclidean geometry codes that become a base are determined. The selected Euclidean geometry codes are rearranged based on a specific relational equation to create a basic matrix. A maximum value of a column weight is selected. In the state that row weights are limited to continuous two kinds, an ensemble of Irregular-LDPC codes is searched by Gaussian approximation. An optimum set of row weights is determined. Rows are deleted in order from the bottom of the basic matrix by considering the number of rows after a division. An ensemble of Irregular-LDPC codes is provisionally searched by Gaussian approximation using a set of row weights. An optimum set of column weights is determined. An optimal ensemble of Irregular-LDPC codes is searched by Gaussian approximation using the set of row weights and the set of column weights as fixed parameters. Finally, weights of the rows and columns of the basic matrix after deleting the rows are divided at random in a predetermined procedure based on this ensemble. As a result, there is an effect that a definite and characteristic-stabilized check matrix for "Irregular-LDPC Codes" corresponding to an optional ensemble, an optional code length, and an optional coding rate can be easily generated in a short time.

According to another aspect of the present invention, the weights in the matrix are rearranged to be disposed at a higher position in columns. With this arrangement, there is an effect that columns of large weights can be left and a variation of weights within columns can be reduced at the time of deleting rows.

According to still another aspect of the present invention, first a code length and a coding rate are determined. Next, weights of rows and columns of a Cayley graph that become a base are determined. A maximum value of a column weight is selected. In the state that row weights are limited to continuous two kinds, an ensemble of Irregular-LDPC codes is searched by Gaussian approximation. An optimum set of row weights is determined. Rows are deleted in order from the bottom of the basic matrix by considering the number of rows after a division. An ensemble of Irregular-LDPC codes is provisionally searched by Gaussian approximation using a set of row weights. An optimum set of column weights is determined. An optimal ensemble of Irregular-LDPC codes is searched by Gaussian approximation using the set of row weights and the set of column weights as fixed parameters. Finally, weights of the rows and columns of the basic matrix after deleting the rows are divided at random in a predetermined procedure based on this ensemble. As a result, there is an effect that a definite and characteristic-stabilized check matrix for "Irregular-LDPC Codes" corresponding to an optional ensemble, an optional code length, and an optional coding rate can be easily generated in a short time.

According to still another aspect of the present invention, the generator function λ(x) and the generator function ρ(x) are calculated in one linear programming. Therefore, it is possible to search a definite and characteristic-stabilized check matrix for LDPC codes more easily and speedily than the method described in the research paper that iteratively executes derivation of the generator functions λ(x) and ρ(x) to derive both optimal values.

According to still another aspect of the present invention, a weight distribution is adjusted such that the total weight number of weight units is equal to an integer, and a sum of the total weight numbers of weight units is equal to the total number of "1"s in Euclidean geometry codes. There is an effect that this realizes more accurate dividing process.

According to still another aspect of the present invention, a condition associated with code characteristics can be defined correctly through creation of a Latin square of random sequences.

According to still another aspect of the present invention, first a code length and a coding rate are determined. Next, Euclidean geometry codes that become a base are determined. The selected Euclidean geometry codes are rearranged based on a specific relational equation to create a basic matrix. A maximum value of a column weight is selected. In the state that row weights are limited to continuous two kinds, an ensemble of Irregular-LDPC codes is searched by Gaussian approximation. An optimum set of row weights is determined. Rows are deleted in order from the bottom of the basic matrix by considering the number of rows after a division. An ensemble of Irregular-LDPC codes is provisionally searched by Gaussian approximation using a set of row weights. An optimum set of column weights is determined. An optimal ensemble of Irregular-LDPC codes is searched by Gaussian approximation using the set of row weights and the set of column weights as fixed parameters. Finally, weights of the rows and columns of the basic matrix after deleting the rows are divided at random in a predetermined procedure based on this ensemble. As a result, there is an effect that a definite and characteristic-stabilized check matrix for "Irregular-LDPC Codes" corresponding to an optional ensemble, an optional code length, and an optional coding rate can be easily generated in a short time.

According to still another aspect of the present invention, first a code length and a coding rate are determined. Next, weights of rows and columns of a Cayley graph that become a base are determined. A maximum value of a column weight is selected. In the state that row weights are limited to continuous two kinds, an ensemble of Irregular-LDPC codes is searched by Gaussian approximation. An optimum set of row weights is determined. Rows are deleted in order from the bottom of the basic matrix by considering the number of rows after a division. An ensemble of Irregular-LDPC codes is provisionally searched by Gaussian approximation using a set of row weights. An optimum set of column weights is determined. An optimal ensemble of Irregular-LDPC codes is searched by Gaussian approximation using the set of row weights and the set of column weights as fixed parameters. Finally, weights of the rows and columns of the basic matrix after deleting the rows are divided at random in a predetermined procedure based on this ensemble. As a result, there is an effect that a definite and characteristic-stabilized check matrix for "Irregular-LDPC Codes" corresponding to an optional ensemble, an optional code length, and an optional coding rate can be easily generated in a short time.

According to still another aspect of the present invention, first a code length and a coding rate are determined. Next, weights of rows and columns of a Cayley graph that become a base are determined. A maximum value of a column weight is selected. In the state that row weights are limited to continuous two kinds, an ensemble of Irregular-LDPC codes is searched by Gaussian approximation. An optimum set of row weights is determined. Rows are deleted in order from the bottom of the basic matrix by considering the number of rows after a division. An ensemble of Irregular-LDPC codes is provisionally searched by Gaussian approximation using a set of row weights. An optimum set of column weights is determined. An optimal ensemble of Irregular-LDPC codes is searched by Gaussian approximation using the set of row weights and the set of column weights as fixed parameters. Finally, weights of the rows and columns of the basic matrix after deleting the rows are divided at random in a predetermined procedure based on this ensemble. As a result, there is an effect that a definite and characteristic-stabilized check matrix for "Irregular-LDPC Codes" corresponding to an optional ensemble, an optional code length, and an optional coding rate can be easily generated in a short time.

INDUSTRIAL APPLICABILITY

As explained above, the method of generating check matrixes for LDPC codes and the check matrix generating apparatus according to the present invention are useful for a communication apparatus that employs LDPC codes as error correcting codes, and are particularly useful for an apparatus that generates a definite and characteristic stabilized "Irregular-LDPC codes".

The invention claimed is:

1. A method of generating a check matrix for a low-density parity-check code in which at least one of weights of a column and a row are not uniform, the method comprising:
determining a code length and a coding rate;
determining the weights of the row and the column to determine a basic matrix that satisfies conditions that "the weights of the row and the column are constant" and "number of cycles is equal to or more than six";
selecting a maximum value of the weight of the column that satisfies a condition of "2<maximum value of the weight of the column≦number of 1s within columns in the basic matrix";
searching provisionally an ensemble of the weights of the row and the column weights of the low-density parity-check code via optimization based on Gaussian approximation in a state that number of the weights of the row are limited to continuous two kinds to determine an optimum set of the weights of the row;

deleting the rows sequentially from a bottom of the basic matrix considering number of rows after a division;

searching provisionally an ensemble of the weights of the row and the column of the low-density parity-check code via optimization based on Gaussian approximation, using the set of the weights of the row as a fixed parameter, to determine an optimum set of the weights of the column;

searching an optimal ensemble of the weights of the row and the column of the low-density parity-check code via optimization based on Gaussian approximation, using the set of the weights of the row and the column as a fixed parameter; and dividing at random the weights of the row and the column of the basic matrix after deleting the rows in a predetermined procedure based on a final ensemble.

2. A method of generating a check matrix for a low-density parity-check code in which at least one of weights of a column and a row are not uniform, using a Euclidean geometry code, the method comprising:

determining a code length and a coding rate;

selecting the Euclidean geometry code that becomes a base;

rearranging the Euclidean geometry code selected, based on a specific relational equation to create a basic matrix;

selecting a maximum value of the weight of the column that satisfies a condition of "2<maximum value of the weight of the column≦number of 1s within columns in the Euclidean geometry code";

searching provisionally an ensemble of the weights of the row and the column weights of the low-density parity-check code via optimization based on Gaussian approximation in a state that number of the weights of the row are limited to continuous two kinds to determine an optimum set of the weights of the row;

deleting the rows sequentially from a bottom of the basic matrix considering number of rows after a division;

searching provisionally an ensemble of the weights of the row and the column of the low-density parity-check code via optimization based on Gaussian approximation, using the set of the weights of the row as a fixed parameter, to determine an optimum set of the weights of the column;

searching an optimal ensemble of the weights of the row and the column of the low-density parity-check code via optimization based on Gaussian approximation, using the set of the weights of the row and the column as a fixed parameter; and dividing at random the weights of the row and the colunm of the basic matrix after deleting the rows in a predetermined procedure based on a final ensemble.

3. The method according to claim 2, wherein the specific relational equation used at the rearranging is generated such that the weights within the matrix are arranged at a higher position within columns.

4. The method according to claim 2, wherein in the Gaussian approximation, the optimal ensemble of the weights of the row and the column, which minimizes a threshold, is searched in a single linear programming such that a Gaussian noise becomes maximum in a state that the coding rate is fixed.

5. The method according to claim 2, wherein at the searching the optimum ensemble of the row and the column of the low-density parity-check code, a weight distribution in the ensemble is adjusted such that a total number of the weights in weight unit is equal to an integer and a sum of the total number of the weights in the weight unit is equal to a total number of is in the Euclidean geometry code, and at the dividing, the dividing 1s performed based on the ensemble after an adjustment.

6. The method according to claim 2, wherein at the dividing, a Latin square of basic random sequence is generated, and a weight of 1 is extracted from each of the rows and each of the columns in the basic matrix after deleting the row, thereby dividing each of the rows and each of the columns at random based on the Latin square.

7. A method of generating a check matrix for a low-density parity-check code in which at least one of weights of a column and a row are not uniform, using a Cayley graph, the method comprising:

determining a code length and a coding rate;

determining the weights of the row and the column in the Cayley graph, which becomes a base, to create a basic matrix;

selecting a maximum value of the weight of the column that satisfies a condition of "2<maximum value of the weight of the column≦number of is within columns in the Cayley graph";

searching provisionally an ensemble of the weights of the row and the column weights of the low-density parity-check code via optimization based on Gaussian approximation in a state that number of the weights of the row are limited to continuous two kinds to determine an optimum set of the weights of the row;

deleting the rows sequentially from a bottom of the basic matrix considering number of rows after a division;

searching provisionally an ensemble of the weights of the row and the column of the low-density parity-check code via optimization based on Gaussian approximation, using the set of the weights of the row as a fixed parameter, to determine an optimum set of the weights of the column;

searching an optimal ensemble of the weights of the row and the column of the low-density parity-check code via optimization based on Gaussian approximation, using the set of the weights of the row and the column as a fixed parameter; and dividing at random the weights of the row and the column of the basic matrix after deleting the rows in a predetermined procedure based on a final ensemble.

8. The method according to claim 7, wherein in the Gaussian approximation, the optimal ensemble of the weights of the row and the column, which minimizes a threshold, is searched in a single linear programming such that a Gaussian noise becomes maximum in a state that the coding rate is fixed.

9. The method according to claim 7, wherein at the searching the optimum ensemble of the row and the column of the low-density parity-check code, a weight distribution in the ensemble is adjusted such that a total number of the weights in weight unit is equal to an integer and a sum of the total number of the weights in the weight unit is equal to a total number of 1s in the Euclidean geometry code, and at the dividing, the dividing is performed based on the ensemble after an adjustment.

10. The method according to claim 7, wherein at the dividing, a Latin square of basic random sequence is generated, and a weight of 1 is extracted from each of the rows and each of the columns in the basic matrix after deleting the row, thereby dividing each of the rows and each of the columns at random based on the Latin square.

11. An apparatus for generating a check matrix for a low-density parity-check code in which at least one of weights of a column and a row are not uniform, using a Euclidean geometry code, the apparatus comprising:
- a code-length/coding-rate determining unit that determines a code length and a coding rate;
- a Euclidean geometry code selecting unit that selects the Euclidean geometry code that becomes a base;
- a rearranging unit that rearranges the Euclidean geometry code selected, based on a specific relational equation to create a basic matrix;
- a maximum-weight selecting unit that selects a maximum value of the weight of the column that satisfies a condition of "2<maximum value of the weight of the column≦number of is within columns in the Euclidean geometry code";
- a first weight searching unit that searches provisionally an ensemble of the weights of the row and the column weights of the low-density parity-check code via optimization based on Gaussian approximation in a state that number of the weights of the row are limited to continuous two kinds to determine an optimum set of the weights of the row;
- a deleting unit that deletes the rows sequentially from a bottom of the basic matrix considering number of rows after a division;
- a second searching unit that searches provisionally an ensemble of the weights of the row and the column of the low-density parity-check code via optimization based on Gaussian approximation, using the set of the weights of the row as a fixed parameter, to determine an optimum set of the weights of the column;
- a third searching unit that searches an optimal ensemble of the weights of the row and the column of the low-density parity-check code via optimization based on Gaussian approximation, using the set of the weights of the row and the column as a fixed parameter; and
- a dividing unit that divides at random the weights of the row and the column of the basic matrix after deleting the rows in a predetermined procedure based on a final ensemble.

12. An apparatus for generating a check matrix for a low-density parity-check code in which at least one of weights of a column and a row are not uniform, using a Cayley graph, the apparatus comprising:
- a code-length/coding-rate determining unit that determines a code length and a coding rate;
- a Cayley-graph determining unit that determines the weights of the row and the column in the Cayley graph, which becomes a base, to create a basic matrix;
- a maximum-weight selecting unit that selects a maximum value of the weight of the column that satisfies a condition of "2<maximum value of the weight of the column≦number of 1s within columns in the Cayley graph";
- a first weight searching unit that searches provisionally an ensemble of the weights of the row and the column weights of the low-density parity-check code via optimization based on Gaussian approximation in a state that number of the weights of the row are limited to continuous two kinds to determine an optimum set of the weights of the row;
- a deleting unit that deletes the rows sequentially from a bottom of the basic matrix considering number of rows after a division;
- a second searching unit that searches provisionally an ensemble of the weights of the row and the column of the low-density parity-check code via optimization based on Gaussian approximation, using the set of the weights of the row as a fixed parameter, to determine an optimum set of the weights of the column;
- a third searching unit that searches an optimal ensemble of the weights of the row and the column of the low-density parity-check code via optimization based on Gaussian approximation, using the set of the weights of the row and the column as a fixed parameter; and
- a dividing unit that divides at random the weights of the row and the column of the basic matrix after deleting the rows in a predetermined procedure based on a final ensemble.

* * * * *

UNITED STATES PATENT AND TRADEMARK OFFICE
CERTIFICATE OF CORRECTION

PATENT NO. : 7,395,484 B2
APPLICATION NO. : 10/518444
DATED : July 1, 2008
INVENTOR(S) : Wataru Matsumoto It is certified that error appears in the above-identified patent and that said Letters Patent is hereby corrected as shown below:

On the Title Page Item (54):

The Title reading "CHECK MATRIX GENERATION METHOD AND CHECK MATRIX GENERATION DEVICE" should read --METHOD AND APPARATUS FOR GENERATING CHECK MATRIX--.

On the Title Page in the (*) Notice Section:

The second reading "Subject to any disclaimer, the term of this patent is extended or adjusted under 35 U.S.C. 154(b) by 45 days." should read --Subject to any disclaimer, the term of this patent is extended or adjusted under 35 U.S.C. 154(b) by 45 days. This patent is subject to a terminal disclaimer.--.

Signed and Sealed this

Twenty-first Day of October, 2008

JON W. DUDAS
*Director of the United States Patent and Trademark Office*

UNITED STATES PATENT AND TRADEMARK OFFICE
CERTIFICATE OF CORRECTION

PATENT NO. : 7,395,484 B2
APPLICATION NO. : 10/518444
DATED : July 1, 2008
INVENTOR(S) : Wataru Matsumoto Page 1 of 1

It is certified that error appears in the above-identified patent and that said Letters Patent is hereby corrected as shown below:

On the Title Page Item (54) and Column 1, lines 1-3:

The Title reading "CHECK MATRIX GENERATION METHOD AND CHECK MATRIX GENERATION DEVICE" should read --METHOD AND APPARATUS FOR GENERATING CHECK MATRIX--.

On the Title Page in the (*) Notice Section:

The second reading "Subject to any disclaimer, the term of this patent is extended or adjusted under 35 U.S.C. 154(b) by 45 days." should read --Subject to any disclaimer, the term of this patent is extended or adjusted under 35 U.S.C. 154(b) by 45 days. This patent is subject to a terminal disclaimer.--.

This certificate supersedes the Certificate of Correction issued October 21, 2008.

Signed and Sealed this

Eleventh Day of November, 2008

JON W. DUDAS
*Director of the United States Patent and Trademark Office*